United States Patent
Sacchetto et al.

(10) Patent No.: US 9,412,940 B2
(45) Date of Patent: Aug. 9, 2016

(54) RESISTIVE SWITCHING ELEMENT AND USE THEREOF

(71) Applicant: ECOLE POLYTECHNIQUE FEDERALE DE LAUSANNE (EPFL), Lausanne (CH)

(72) Inventors: Davide Sacchetto, Lausanne (CH); Shashi Kanth Bobba, Renens (CH); Pierre-Emmanuel Julien Marc Gaillardon, Renens (CH); Yusuf Leblebici, Lutry (CH); Giovanni De Micheli, Lausanne (CH); Tugba Demirci, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 14/418,859

(22) PCT Filed: Jul. 19, 2013

(86) PCT No.: PCT/IB2013/055941
§ 371 (c)(1),
(2) Date: Jan. 30, 2015

(87) PCT Pub. No.: WO2014/020478
PCT Pub. Date: Feb. 6, 2014

(65) Prior Publication Data
US 2015/0200363 A1    Jul. 16, 2015

(30) Foreign Application Priority Data

Aug. 3, 2012 (EP) .................. 12179314
Aug. 3, 2012 (EP) .................. 12179317
Feb. 20, 2013 (EP) .................. 13156034

(51) Int. Cl.
*G11C 11/00* (2006.01)
*H01L 45/00* (2006.01)
(Continued)

(52) U.S. Cl.
CPC .......... *H01L 45/1253* (2013.01); *G11C 13/004* (2013.01); *G11C 13/0007* (2013.01);
(Continued)

(58) Field of Classification Search
USPC .................. 365/148, 174, 175; 257/2, 4, 5
See application file for complete search history.

(56) References Cited

U.S. PATENT DOCUMENTS 6,275,370 B2 * 8/2001 Gnade .................... 257/306
7,420,198 B2 * 9/2008 Baek ................ H01L 27/112
257/2

(Continued)

OTHER PUBLICATIONS

"ABC, A System for Sequential Synthesis and Verification," Berkeley Logic Synthesis and Verifaction Group, Sep. 20, 2012, 21 pages [retrieved from: http://www.eecs.berkeley.edu/~alanmi/abc].
(Continued)

*Primary Examiner* — Vu Le
(74) *Attorney, Agent, or Firm* — Sheridan Ross P.C.

(57) ABSTRACT

A bipolar resistive switching device (RSM device, FIG. 35) comprises an electrically conductive bottom electrode (BE, FIG. 35); a stack of transition metal oxides layers (RSM, FIG. 35), a number of transition metal oxide layers (RSO, FIG. 35) being equal or greater than 2, the stack comprising: at least one $MO_x$ layer (RSOA, FIG. 35), at least one oxygen gettering layer $NO_y$ (RSOB, FIG. 35). The resistive switching device further comprises an electrically conductive top electrode (TE, FIG. 35).

8 Claims, 25 Drawing Sheets a)

b)

(51) Int. Cl.
*G11C 13/00* (2006.01)
*H03K 17/62* (2006.01)
*H01L 27/24* (2006.01)

(52) U.S. Cl.
CPC ........ *G11C13/0026* (2013.01); *G11C 13/0028* (2013.01); *G11C 13/0069* (2013.01); *H01L 45/08* (2013.01); *H01L 45/1233* (2013.01); *H01L 45/146* (2013.01); *H01L 45/1616* (2013.01); *H01L 45/1625* (2013.01); *H03K 17/6257* (2013.01); *G11C 13/0064* (2013.01); *G11C 2013/0045* (2013.01); *G11C 2013/0073* (2013.01); *G11C 2213/56* (2013.01); *G11C 2213/72* (2013.01); *H01L 27/2463* (2013.01)

(56) References Cited

U.S. PATENT DOCUMENTS

| | | |
|---|---|---|
| 2009/0039332 A1 | 2/2009 | Lee et al. |
| 2010/0258782 A1 | 10/2010 | Kuse et al. |
| 2012/0091427 A1 | 4/2012 | Chen et al. |
| 2012/0178210 A1* | 7/2012 | Lee .................... H01L 45/04 438/104 |

OTHER PUBLICATIONS

Burr et al. "Overview of candidate device technologies for storage-class memory," IBM Journal of Research and Development, Jul./Sep. 2008, vol. 52, No. 4/5, pp. 449-464.

Cagli et al. "Experimental and Theoretical Study of Electrode Effects in HfO2 based RRAM," IEDM Tech. Dig., 2011, 4 pages.

Chen et al. "Challenges and Opportunities for HfOX Based Resistive Random Access Memory," IEDM Tech. Dig., 2011, 4 pages.

Cong et al. "mrFPGA: A Novel FPGA Architecture with Memristor-Based Reconfiguration," NANOARCH Tech. Dig, 2011, 8 pages.

Gaillardon et al. "Emerging Memory Technologies for Reconfigurable Routing in FPGA Architecture," ICECS Tech. Dig., 2010, pp. 62-65.

Han et al. "Flash-based Field Programmable Gate Array Technology with Deep Trench Isolation," IEEE 2007 Custom Integrated Circuits Conference (CICC), 2007, pp. 89-91.

Kim et al. "Reproducible resistance swithing characteristics of hafnium oxide-based nonvolatile memory devices," Journal of Applied Physics, Dec. 2008, vol. 104, No. 11, 7 pages.

Liauw et al. "Nonvolatile 3D-FPGA With Monolithically Stacked RRAM-Based Configuration Memory," 2012 IEEE International Solid-State Circuits Conference (ISSCC 2012), 2012, Session 23, 3 pages.

Lin et al. "Performance Benefits of Monolithically Stacked 3D-FPGA," IEEE TCAD, 2007, vol. 26, No. 2, pp. 113-122.

Linn et al. "Complementary resistive switches for passive nanocrossbar memories," Nature Materials, May 2010, vol. 9, pp. 403-406.

Luu et al. "Architecture Description and Packing for Logic Blocks with Hierarchy, Modes and Complex Interconnect," ACM FPGA Symp., 2011, 10 pages.

Miao et al. "Continuous Electrical Tuning of the Chemical Composition of TaOx-Based Memristors," ACS NANO, 2012, vol. 6, No. 3, pp. 2312-2318.

Sacchetto et al. "Resistive Programmable Through-Silicon Vias for Reconfigurable 3-D Fabrics," IEEE Transactions on Nanotechnology, Jan. 2012, vol. 11, No. 1, pp. 8-11.

Sheu et al. "A 4Mb Embedded SLC Resistive-RAM Macro with 7.2ns Read-Write Random-Access Time and 160ns MLC-Access Capability," 2011 IEEE International Solid-State Circuits Conference, 2011, Session 11, 3 pages.

Tanachutiwat et al. "FPGA Based on Integration of CMOS and RRAM," IEEE Transactions on Very Large Scale Integration (VLSI) Systems, Nov. 2011, vol. 19, No. 11, pp. 2023-2032.

Waser et al. "Nanoionics-based resistive switching memories," Nature Materials, Nov. 2007, vol. 6, pp. 833-840.

Wei et al. "Highly Reliable TaOx ReRAM and Direct Evidence of Redox Reaction Mechanism," IEDM 2008, 2008, 4 pages.

Zhu et al. "Charging-Induced Changes in Reverse Current-Voltage Characteristics of Al/Al-Rich Al2O3/p-Si Diodes," IEEE Transactions on Electron Devices, Sep. 2009, vol. 56, No. 9, pp. 2060-2064.

International Search Report prepared by the European Patent Office on Nov. 21, 2013, for International Application No. PCT/IB2013/055941.

Written Opinion prepared by the European Patent Office on Nov. 21, 2013, for International Application No. PCT/IB2013/055941.

Lee H Y et al: "Low Power and high speed bipolar switching with a thin reactive Ti buffer layer in robust Hf02 based RRAM", IEEE International Electron Devices Meeting, Dec. 15-17, 2008, San Francisco, CA, USA, 2008, pp. 1-4.

Lee J et al: "Diode-less nano-scale ZrOx/Hf0x RRAM device with excellent switching uniformity and reliability for high-density cross-point memory applications", IEEE International Electron Devices Meeting, Dec. 6-8, 2010, San Francisco, CA, USA, 2010, pp. 19.5.1-19.5.4.

Liu T et al: "Novel highly nonlinear memristive circuit elements for neural networks", International Joint Conference on Neural Networks, Jun. 10-15, 2012, Brisbane, Australia, 2012, pp. 1-8.

\* cited by examiner

RESISTIVE SWITCHING ELEMENT AND USE THEREOF

CROSS REFERENCE TO RELATED APPLICATIONS

This application is a national stage application under 35 U.S.C. 371 and claims the benefit of PCT Application No. PCT/IB2013/055941 having an international filing date of Jul. 19, 2013, which designated the United States, which PCT application claimed the benefit of European Patent Application No. 12179314.5 filed Aug. 3, 2012; European Patent Application No. 12179317.8 filed Aug. 3, 2012; and European Patent Application No. 13156034.4 filed Feb. 20, 2013, the disclosures of each of which are incorporated herein by reference in their entirety.

FIELD OF INVENTION

The present invention relates to a resistive switching device consisting of non-stochiometric transition metal oxide stack and more precisely to processes for manufacturing such material stack. The present invention also relates to a generic memory structure and complementary resistive programming. The present invention further relates to a circuit utilized for read/write of memory arrays and the writing protocol methodology. The present invention further encompasses a method of integration of memory arrays with the Back End of the Line of the fabricated circuit.

BACKGROUND

Bulk CMOS technologies are predicted to face crucial technological challenges in the next decade. At the same time, novel devices based on Resistive Switching Materials (RSM) do not suffer from the same constraints and are expected to play a primary role as devices in future ultra-large scale integration technologies, for both memory and logic applications.

The interest in these devices is motivated not only by their small size, but also their superior characteristics, such as non-volatile memory storage, two-terminal connection and excellent scalability down to the 1 nm range. The RSM, specifically, plays a major role in the current efforts towards effective implementation of the device for practical applications, with manufacturers currently exploring resistive switching materials as future bricks for stand-alone memories as well as for applications in neuromorphic circuits as well as logic-in-memory.

TaOx/CrOy ReRam Element—Background

In literature, transition-metal oxide memory technologies base their working principle on the change of their resistance state due to a modification of the conductivity property of the oxide itself. Two major groups of transition metal oxide-based resistive switching elements can be identified by considering the physical mechanism that drives the modification of the resistance state.

The first group consists of two-terminal devices based on metal/oxide switches, such as $SiO_2$, $HfO_2$ [1] or $Al_2O_3$ [2]. These devices behave as solid-state electrochemical switches, the resistance of which is defined by a metallic filament formation mechanism related to the solid-state redox reactions stimulated by the applied electric field [3]. The writing mechanism does not require opposite voltage polarities. This mechanism is also known as unipolar.

A second group is related to the vacancy redistribution in transition metal oxide ($MO_x$, where M denotes the transition metal, O denotes oxygen and the x is a stochiometric number) layers upon applying a voltage and it causes the switching from an insulating to a metallic state. For instance, considering $TiO_2$, the diffusion of oxygen vacancies transforms the $TiO_2$ volume into a highly conductive $TiO_{2-x}$ layer, thus reducing the total resistance of the oxide layer. Upon application of an electric field with opposite polarity, the redistribution of oxygen vacancies is led toward the opposite electrode and total resistance is increased again as the proportion of stochiometric $TiO_2$ increases with respect to $TiO_{2-x}$. Since the writing of this cell relies on the application of opposite voltage polarities, the writing mechanism is often labeled as bipolar. Note that the unipolar or bipolar nature of the switching functionality in $MO_x$ depends also on the chemical nature of the top and bottom electrodes [4].

To summarize the state-of-the-art, note that the resistive memories are composed of an oxide mono-layer stacked between 2 metal electrodes.

Generic Memory Structure and Complementary Resistive Programming—Background

Future deeply scaled circuits will see their performances limited by the physical limitations of the materials. To keep pushing the performance of computation and the density of storage, the microelectronics industry envisages using more efficient state variable than the electronic charge. When considering the resistive switching materials, excellent scalability and programming time can be obtained if compared to traditional Flash. This is related to the fact that RSM can be arranged are simple two-terminal resistive switching devices [1A, 2A].

While a lot of research effort targets high density RSM-based standalone memories [3A], one aim of the present invention is the usage of RSM devices for Field-Programmable Gate Arrays (FPGAs). The reason behind this choice is that in reconfigurable logic, up to 40% of the area is dedicated to the storage of configuration signals [4A]. Traditionally, the configuration data is serially loaded in SRAM cells, distributed throughout the circuit [5A]. As a consequence, circuit power on is limited by slow serial configuration. To overpass SRAM volatility and loading time, Flash NVM have been proposed [6A]. Nevertheless, the use of a hybrid CMOS-Flash technology results in high fabrication cost. Conversely, RSM devices are fabricated within the Back-End-of-the-Line (BEoL) metal lines, moving the configuration memory to the top of the chip and reducing the area utilization[7A]. Similarly, the RSM devices can be utilized in combination with Through-Silicon-Via (TSVs), enabling 3-D stacked FPGA architectures [8A].

With the recent development of RSM technology, a number of novel FPGA building blocks and architectures have been proposed in the past few years. For example, routing structures based on RSM devices have shown promise. In [9A], a cross point for switch-boxes, using the RSM devices as non-volatile switches, is proposed to route signals through low-resistive paths, or to isolate them by means of high-resistive paths. The concept of routing elements based on RSM switches was then exploited in [10A, 11A] for timing optimization in FPGAs.

The present invention appear to offer a complete proof of concept of a RSM-based Generic Memory Structure (GMS) circuit for FPGAs from technology development to architectural evaluation. The main idea is to replace the pass-transistors in SRAM-based FPGAs by RSMs. Hence, the RSMs store the information in their resistive states and can be used either to route signals through low-resistive paths, or to isolate them by means of high-resistive paths. Such functionality is used to build either routing Multiplexers (MUXs) or configuration nodes. In order to keep the programming complexity as per SRAM-based FPGAs, we propose an efficient methodology based on the Generic Memory Structure (GMS) complementary programming. The proposed methodology has been validated by electrical measurements on a fabricated GMS device. Finally, the impact of the GMS MUXs and configuration memories is studied at the system level over a set of complex benchmarks. We show that the GMS-based FPGA reduces area by 7%, while the low on-resistance of RSM devices provide a gain of 58% in delay compared to SRAM-based counterpart.

Read/Write Circuitry—Background

In order to gain full advantages of the RSM device arrays, it is crucial for the integration to be CMOS compatible, having a thermal budget compatible with CMOS Back-End-of-the-Line (BEoL) and the possibility for the memory array to be integrated into a CMOS chip by post-processing. It is thus crucial that a dedicated read/write circuit is able to tackle the issues coming from RSM device arrays and specifically implement a dedicated read/write protocol.

SUMMARY OF INVENTION

In a first aspect the invention provides a bipolar resistive switching device comprises an electrically conductive bottom electrode; a stack of transition metal oxides layers, a number of transition metal oxide layers being equal or greater than 2. The stack comprises at least one $MO_x$ layer, at least one oxygen gettering layer $NO_y$. The resistive switching device further comprises an electrically conductive top electrode.

In a preferred embodiment the oxygen gettering layer comprises a transition metal oxide taken from the list comprising: $CrO_y$, $TiO_y$, $HfO_y$, $NbO_y$.

In a preferred embodiment a value of the stochiometric number y is in the range $0<y\leq2$.

In a preferred embodiment values of the stochiometric number x is in the range $0<x\leq2.5$.

In a preferred embodiment the metal M is taken from the list comprising: Cr, Ti, Hf, Ta, Nb.

In a preferred embodiment the stack of transition metal oxide layer further includes at least one layer of metal (INTE).

In a second aspect the invention provides a process for manufacturing a bipolar resistive switching device comprising steps of creating a bottom electrode from an electrically conductive material, creating a top electrode from an electrically conductive material, and creating a stack of transition metal oxide layers sandwiched in between the top electrode and the bottom electrode, a number of transition metal oxide layers being equal or greater than 2. The stack comprises at least one $MO_x$ layer, and at least one oxygen gettering layer $NO_y$.

In a preferred embodiment of the inventive process the oxygen gettering layer comprises a transition metal oxide $NO_y$, wherein the metal N is taken from the list comprising: Cr, Ti, Hf, Nb.

In a preferred embodiment of the inventive process the metal M is taken from the list comprising: Cr, Ti, Hf, Ta, Nb.

In a preferred embodiment, the process further comprises a step of creating at least one layer of metal to be included in the stack of transition metal oxide layers.

In a preferred embodiment of the inventive process the step of creating the electrically conductive bottom electrode comprises starting from an electrically insulated Si substrate, and depositing the bottom electrode (BE) lines with a lift-off method, the step of creating the stack of metal oxide layers comprises depositing the $MO_x$ layer by means of sputtering from a $MO_z$ target, wherein values of the stochiometric number z is in the range $0\leq z\leq 2.5$, and evaporating a metallic N layer thereby forming the oxygen gettering $NO_y$ layer at the interface between N and $TaO_x$, and the step of creating the electrically conductive top electrode comprises starting from the metal oxide layer, and depositing the top electrode lines with a lift-off method.

In a preferred embodiment of the inventive process a value of the stochiometric number y is in the range $0<y\leq2$.

In preferred embodiment of the inventive process values of the stochiometric number x is in the range $0<x\leq2.5$.

In a preferred embodiment of the inventive process the electrically conductive electrodes in the steps of creating the bottom electrode, and creating the top electrode, and the metal oxide layers in the step of creating the metal oxide layers stack, are obtained by deposition steps which correspond to one of the following: sputtering deposition; evaporation method; atomic layer deposition.

In a preferred embodiment of the inventive process the step of creating the stack of metal oxide layers comprises: depositing the $MO_x$ layer by means of sputtering from a $MO_z$ target, wherein values of the stochiometric number z is in the range $0\leq z\leq 2.5$, and evaporating a metallic N layer thereby forming the oxygen gettering $NO_y$ layer at the interface between N and $TaO_x$. The step of creating the electrically conductive top electrode comprises starting from the metal oxide layer, and depositing the top electrode lines with a lift-off method.

In a preferred embodiment of the inventive process the step of creating the electrically conductive bottom electrode comprises depositing bottom electrode lines starting from a CMOS circuit.

In a preferred embodiment of the inventive process the step of creating the electrically conductive bottom electrode comprises starting from a CMOS circuit, the CMOS circuit comprising conductive electrode lines which are used as the electrically conductive bottom electrode.

In a preferred embodiment of the inventive process the step of creating the electrically conductive bottom electrode comprises depositing bottom electrode lines starting from an electrically insulated Si substrate.

In a preferred embodiment of the inventive process the step of creating the electrically conductive bottom electrode comprises starting from an electrically insulated Si substrate, the electrically insulated Si substrate comprising conductive electrode lines which are used as the electrically conductive bottom electrode.

In a third aspect the invention provides a circuit comprising 2 bipolar resistive switching devices according to the invention, the 2 bipolar resistive switching devices being serially connected in such a way that their polarities are opposed.

In a fourth aspect the invention provides a multiplexer circuit comprising a plurality of bipolar resistive switching devices and transistors, wherein the bipolar resistive switching devices serve as routing switching and wherein transistors serve for programming the multiplexer circuit.

In a fifth aspect the invention provides a read/write circuit comprising: a digital controller that has a digital state machine configured to control write operation according to a protocol; and an analog read circuitry. The latter comprises a high gain differential amplifier, a current comparator and a current calibration circuitry designed for a column, whereby the analog read circuitry comprises a high gain operational amplifier (opamp), a voltage comparator and a voltage calibration circuitry. The read/write circuit further comprises a further analog read circuitry to set each un-selected row voltage to the same voltage level as the column voltage levels; a reference voltage generation block controlled by the digital controller to keep the row and column voltage levels at sufficient voltage levels in order to program a Resistive Switching Material element contents with minimum current consumption; and column and row decoders controlled by the digital controller to select the appropriate voltage level on the selected row and selected column.

In a preferred embodiment of the read/write circuit a sequence of write operations is applied and verified by a sequence of read operations to ensure that a specific resistive switching material stores a specific resistance state.

In a preferred embodiment of the inventive programming operation each one of the voltage signals $-5V \leq V_{p1} \leq +5V$, $-5V \leq V_{p2} \leq +5V$, $-5V \leq V_{p3} \leq +5V$ are simultaneously applied to each one of the electrodes forming the circuit, causing the two bipolar resistive switching devices to simultaneously change resistive state.

BRIEF DESCRIPTION OF THE FIGURES

The invention will now be explained in more detail by describing preferred embodiments and referring to figures, wherein.

DETAILED DESCRIPTION OF THE INVENTION

General Description of the ReRam Switching Device

The present invention provides a device consisting of one—or more—stacked layers of non-stochiometric transition metal oxides $MO_x$ and a non-stochiometric oxygen gettering layer also made of transition metal oxide $NO_y$, sandwiched between two metal electrodes. The application of an electric field between the two metal layers imposes a current flux through the transition metal oxide stack (RSM stack), which might cause an individual resistive switching of the transition metal oxides composing the stack upon application of a sufficiently large (positive or negative) electric field.

This structure differs from the typical RSM stack where only one oxide layer type is utilized to form a RSM device.

The present invention further provides a method for obtaining the device as described herein.

First Embodiment

Figure 1:
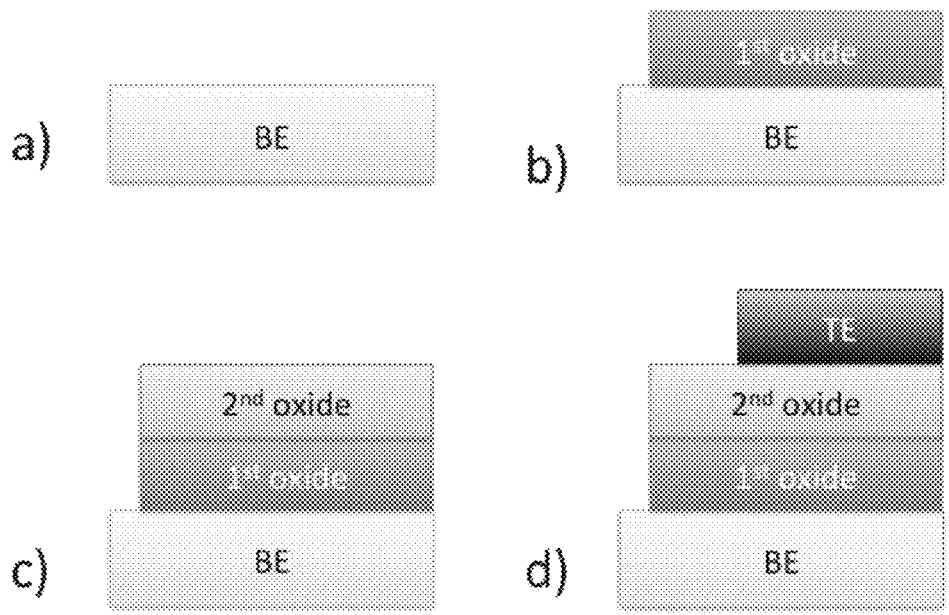
FIG. 1 illustrates an example embodiment of a transition metal oxide bi-layer stack according to the invention.

In a first embodiment, the device consists of a bi-layer oxide stack ($TaO_x/CrO_y$) sandwiched between 2 metal electrodes. The associated fabrication process flow can be sketched as the following:

after the bottom electrode is fabricated (FIG. 1-*a*), a $1^{st}$ oxide layer is created (FIG. 1-*b*). The oxide can be formed by oxidation of the bottom electrode, or by deposition of the oxide with sputtering or evaporation or atomic layer deposition methods. A $1^{st}$ oxide layer is formed on top or around the bottom electrode. Then a $2^{nd}$ oxide layer is formed on top of the $1^{st}$ oxide layer (FIG. 1-*c*). After the $2^{nd}$ oxide layer is formed, a top electrode is deposited on top of the $2^{nd}$ oxide layer (FIG. 1-*d*).

Note that the deposited materials might results of:
the forming of an oxide stack with stochiometry, with x ranging from $0 < x \leq 2.5$ and y ranging from $0 < y \leq 2$;
the combination of graded $TaO_x$ and/or $CrO_y$ and stochiometrically-defined $TaO_x$ and/or stochiometrically-defined $CrO_y$;
the forming of $TaO_x$ and/or $CrO_y$ layers are doped with any of the elements of the periodic table.

Figure 2:
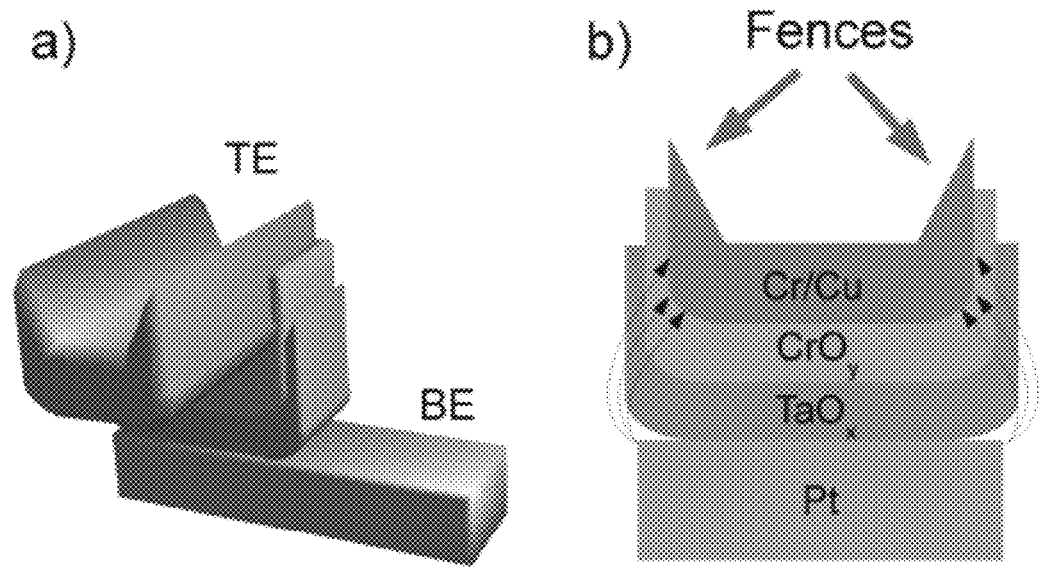
FIG. 2 illustrates a real device sketch as per the embodiment shown in FIG. 1. (a) 3D cross-point RSM device concept with fence-like Top Electrode (TE) shape. (b) Lateral cross-section view of Pt/TaO$_x$/CrO$_y$/Cr/Cu cross-point RSM device. The fence-like TE enables better scalability of the cross-point device thanks to a reduction of the intense electric field distribution at the corners.

More precisely, the device scheme is shown in FIG. 2-*a*. The device consists of a Bottom Electrode (BE), a stack of $TaO_x$ and $CrO_y$ oxides and Cr/Cu Top Electrode (TE), as depicted in FIG. 2-*b*. Note that the layers shape (fence like) enables better scalability thanks to a reduction of the intense electric field distribution at the corners.

Generally, the process includes creating a bottom electrode, which is made of an electrically conductive or semi-conductive material, an electrically conductive TE and an oxide stack sandwiched in between TE and BE. The fabrication starts from an electrically insulated Si substrate or from a fabricated CMOS circuit, then BE lines are deposited with a lift-off method. Then a $1^{st}$ oxide is deposited by means of sputtering of $TaO_x$ from a $Ta_2O_5$ target. Then a metallic Cr layer is evaporated and a $2^{nd}$ oxide $CrO_y$ forms at the interface between Cr and $TaO_x$. Finally a Cu top electrode is evaporated. Cr and Cu are patterned with a lift-off technique. Application of the proposed flow to a real test stack is given in the next section.

Device Fabrication

Figure 5:
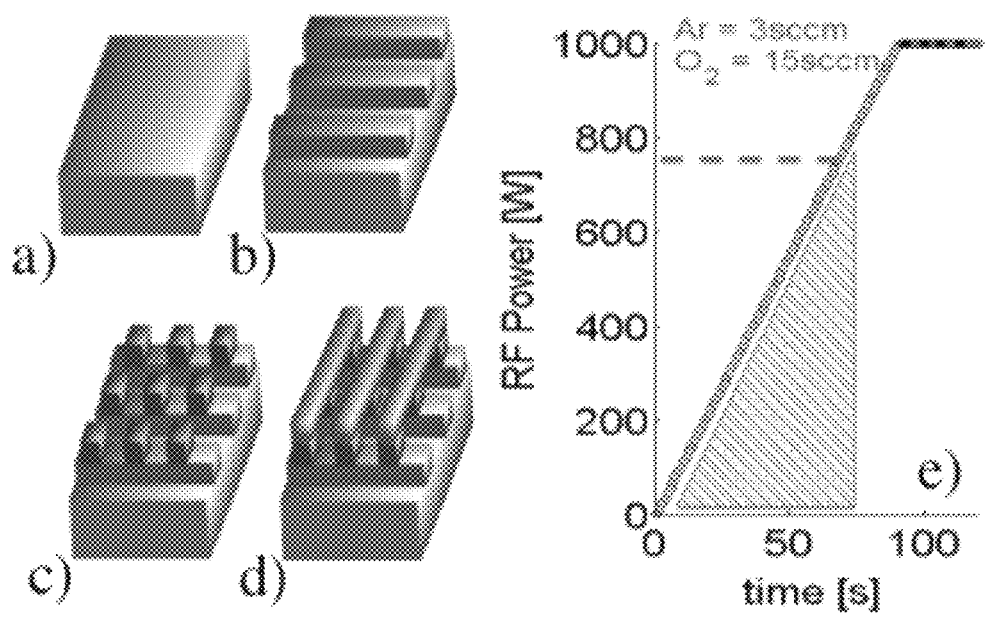
FIG. 5 illustrates a process flow according to an embodiment of the invention. (a) Insulated Si substrate; (b) Pt bottom electrode lift-off; (c) TaO$_x$ sputtering deposition; (d) TE lift-off (e) Sputtering parameters of TaO$_x$, with increasing radio-frequency power and constant 3 sccm/15 sccm Ar/O$_2$ flows.
Figure 6:
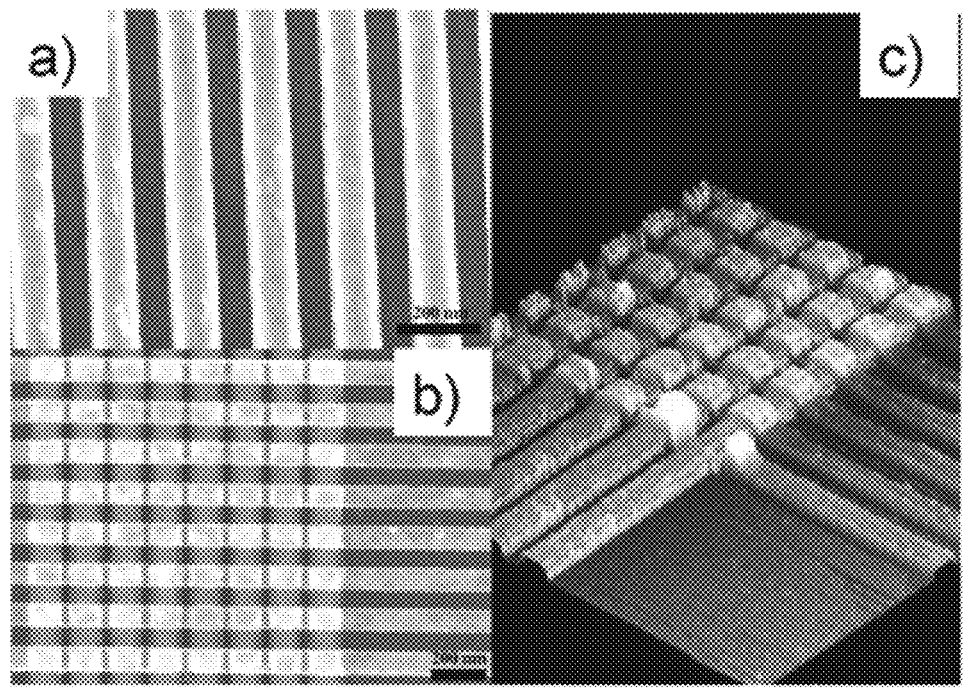
FIG. 6 illustrates a Scanned Electron Microscope (SEM) top view of (a) bottom electrode lines; (b) complete 64 bit crossbar array of devices with 100 nm half-pitch; (c) reconstructed 3-dimensional (3D) image from Atomic Force Microscopy (AFM) profile.
Figure 7:
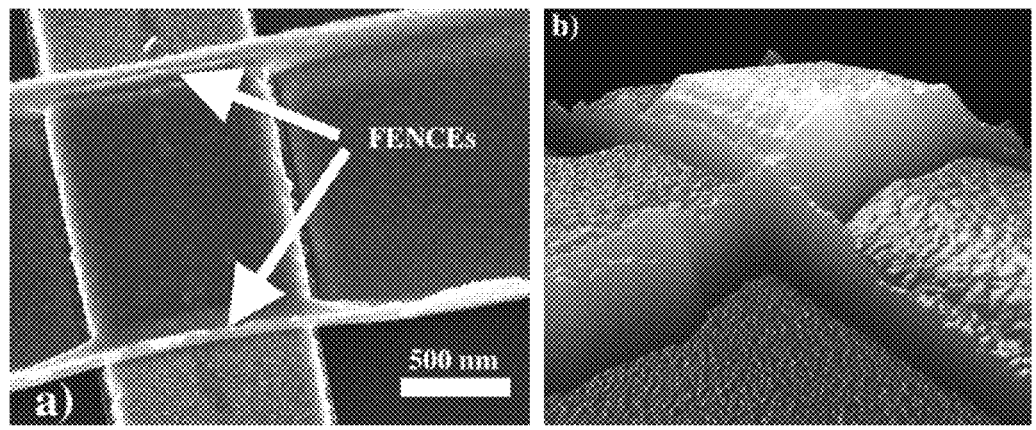
FIG. 7 shows a Pt/TaO$_x$/CrO$_y$/Cr/Cu cross-point device with 900 nm×900 nm cross-point area. (a) Tilted SEM image view. Notice the fence-like structures at the edges of the TE line. (b) Reconstructed 3D AFM image of the pristine cross-point device. Average roughness on TE is σ≈42.6 nm.

The device concept is a cross-point of 2 metal lines with a transition metal oxide sandwich (FIG. 2-*a*). The shape of the TE is optimized to improve scalability (FIG. 2-*b*). Bulk-Si wafers are isolated by depositing 100 nm thick $Al_2O_3$ with Atomic Layer Deposition (ALD) (FIG. 5-*a*). Then, PMMA bi-layers are patterned with e-beam lithography as lift-off masks for 10 nm/80 nm Pt BE deposition (FIG. 5-*b*). In the next step, a second lift-off mask is defined and 15 nm $TaO_x$ oxide layer (FIG. 5-*c*) is deposited by sputtering from a $Ta_2O_5$ target with increasing radio frequency power in $Ar/O_2$ atmosphere (FIG. 5-*e*). Finally, 50 nm/100 nm thick Cr/Cu bi-layers TE are deposited by e-beam evaporation (FIG. 5-*d*). For $Al/TiO_2/Al$ devices, the Al electrodes are deposited with e-beam evaporation while 10 nm thick $TiO_2$ is deposited by ALD. In FIG. 6-*ab* SEM images of 100 nm wide BE lines and 64 bit passive crossbar (consisting of BE lines, transition metal oxide stack and TE lines, being the BE lines and the TE lines arranged orthogonally) are shown, respectively. In FIG. 6-*c*, a 3D reconstructed AFM profile is shown. About 250 individual $Pt/TaO_x/CrO_y/Cr$ cross-points for area sizes varying from 100 nm×100 nm to 1 µm×1 µm, and 64 bit cross-bars with half-pitch varying from 100 nm×100 nm to 500 nm×500 nm are built on the same sample following the proposed fabrication steps. In FIG. 7-*ab*, a tilted SEM view, and a 3D reconstructed AFM profile of a cross-point device with fence-like TE are shown.

Device Characterization

Figure 8:
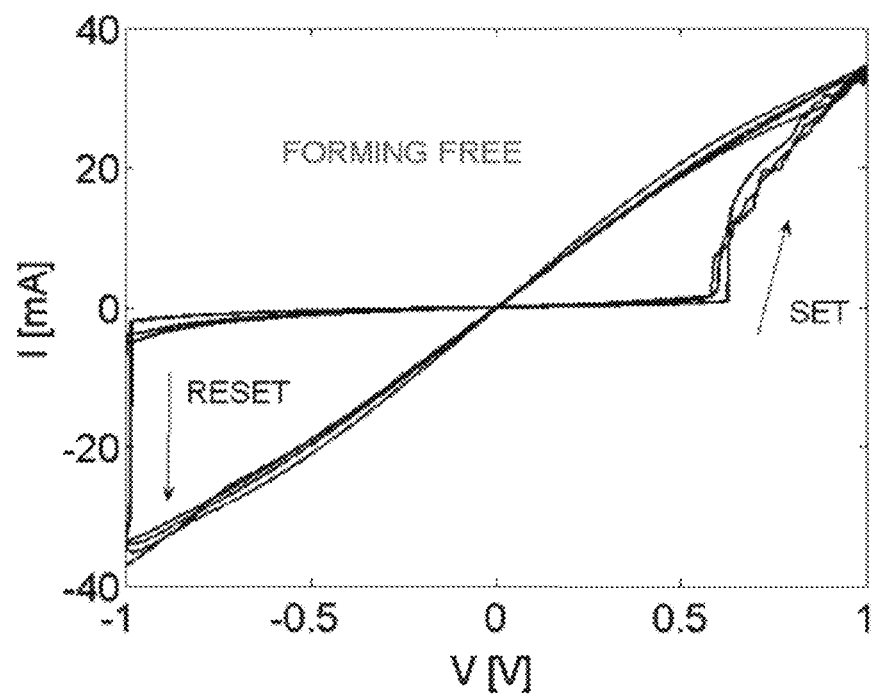
FIG. 8 contains a typical I-V characteristic of the Pt/TaO$_x$/CrO$_y$/Cr ReRAM cell showing resistance ratio of 10$^4$. Notice very low $V_{SET}$=0.8 V and $V_{RESET}$=−1 V. After fabrication the devices are forming-free and in the ON state.
Figure 9:
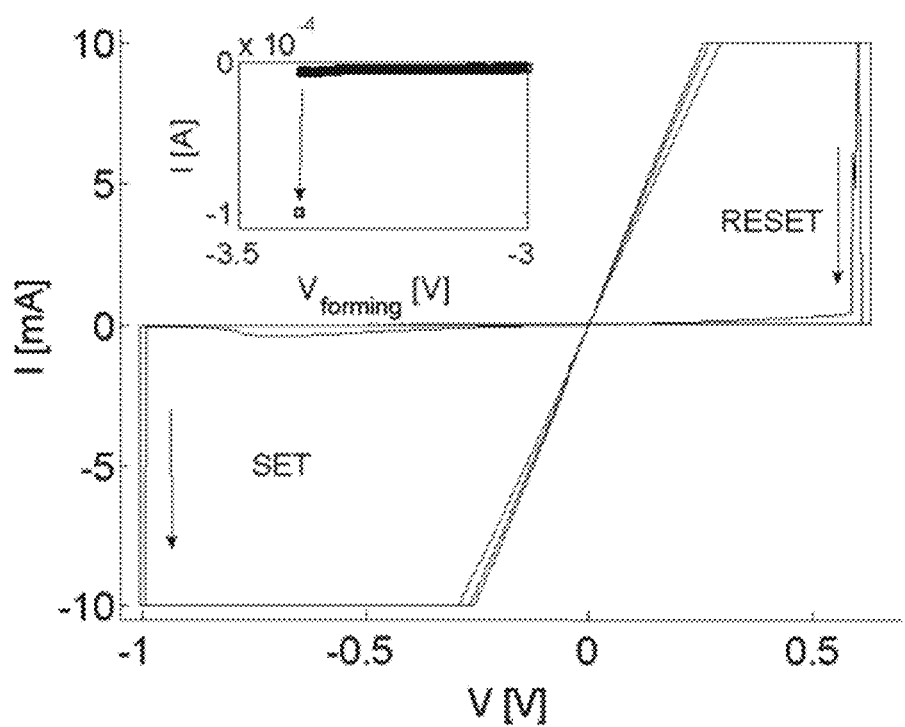
FIG. 9 contains a typical I-V characteristic of the Al/TiO$_2$/Al ReRAM cell after forming with $V_{SET}$=−1 V and $V_{RESET}$=+0.8 V. Inset shows $V_{FORMING}$=−3.4 V.

Electrical measurements are carried out with an Agilent B1500 semiconductor device analyzer. Pulse mode sweeps with pulses of 500 µs demonstrate forming-free Bipolar Resistive Switching (BRS) for $Pt/TaO_x/CrO_y/Cr$ (FIG. 8). The BRS is obtained for a voltage range of less than 1 V with pristine ON state in the same range of the Low Resistance State (LRS). This is an important advantage compared with non forming-free RSM devices, because the forming operation requires higher voltages. A forming voltage of −3.4 V has indeed been necessary for the Al/TiO$_2$/Al (FIG. 9), that then show similar performance as the Pt/TaO$_x$/CrO$_y$/Cr devices.

Switching Mechanism

Figure 10:
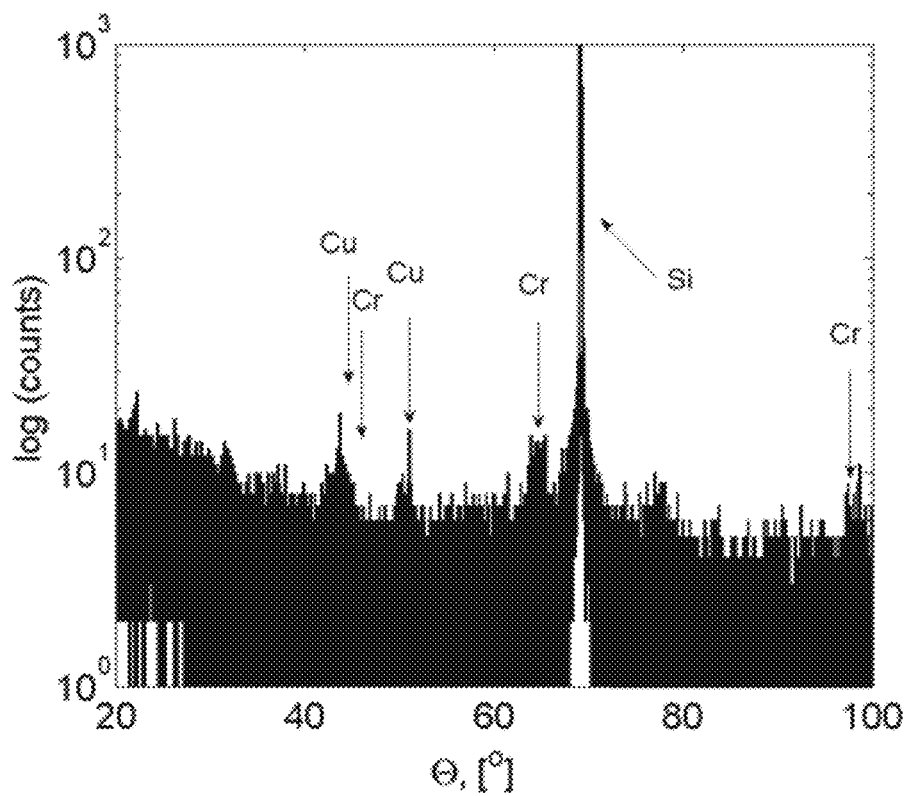
FIG. 10 contains an X-ray diffraction pattern on a Si wafer demonstrating amorphous TaO$_x$/CrO$_y$. The peaks are related to the presence of Cu and Cr metal layers on top of the TaO$_x$/CrO$_y$. The Si peak comes from the substrate and it has been utilized for the calibration of the X-ray diffractometer.
Figure 11:
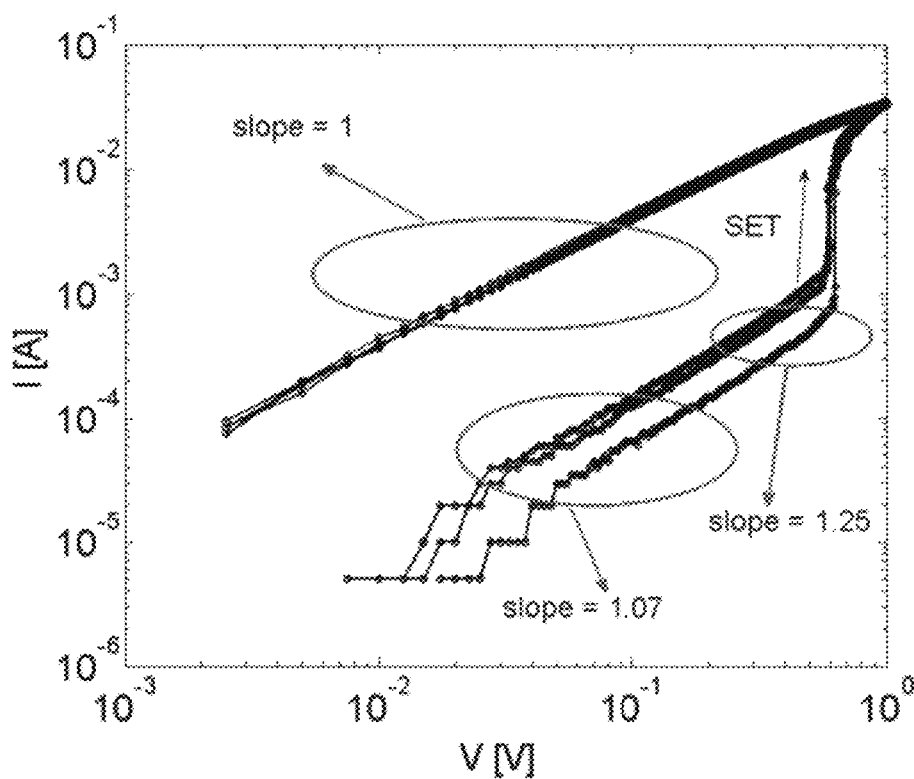
FIG. 11 contains a log(I)-log (V) plot of Pt/TaO$_x$/CrO$_y$/Cr/Cu which shows typical trap-controlled conduction of Space-Charge-Limited-Conduction (SCLC) before SET. In the SET region, the slope is about 25 and it is indication of gradual distribution of defects.
Figure 12:
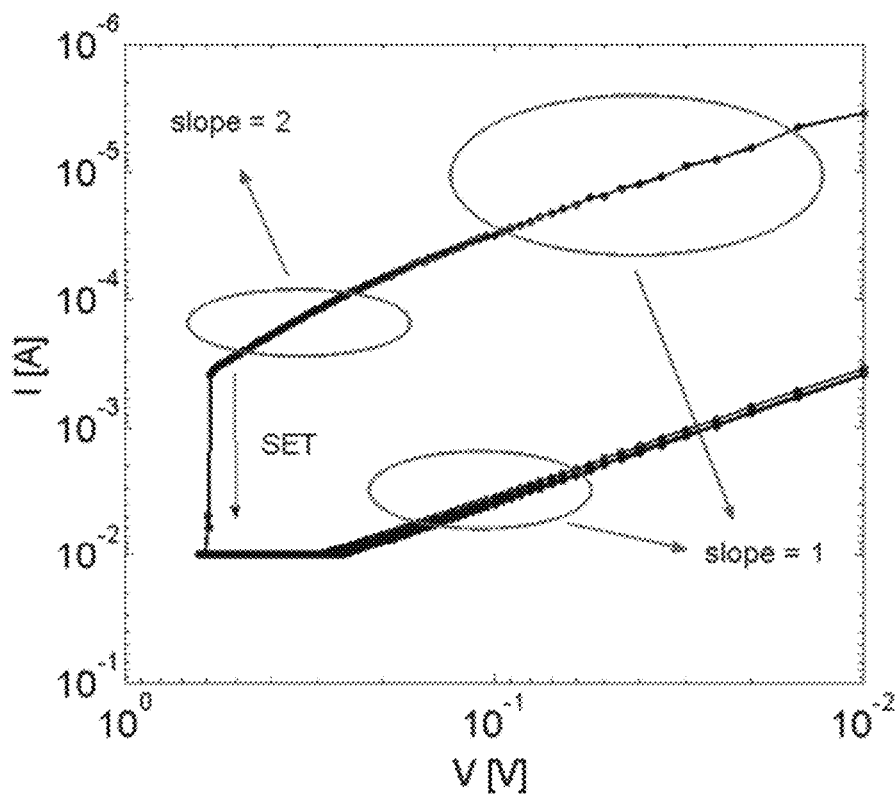
FIG. 12 contains a log(I)-log (V) plot of the Al/TiO$_2$/Al which shows typical trap-controlled conduction of SCLC with quadratic V dependence before SET condition, thus following Child's law dependence. In the SET region, the slope is about 50, and it is indication of an abrupt distribution of defects.
Figure 13:
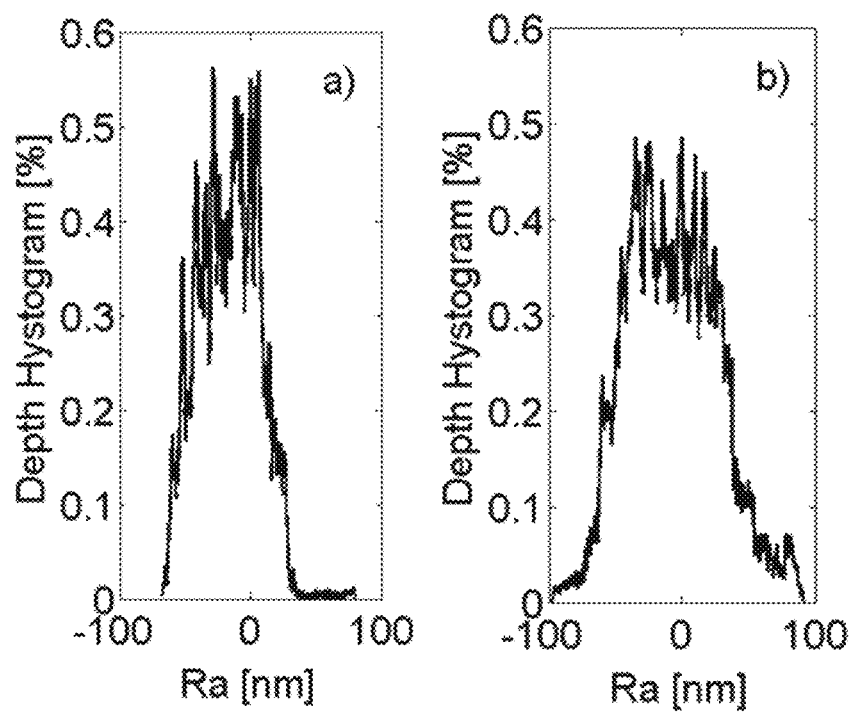
FIG. 13 shows an average roughness profiles for TaO$_x$ cross-points a) σ≈42.6 nm after fabrication b) σ≈56.3 nm after 100 cycles. The broadening is attributed to the structural change induced by the motion of oxygen-vacancies upon cycling.
Figure 14:
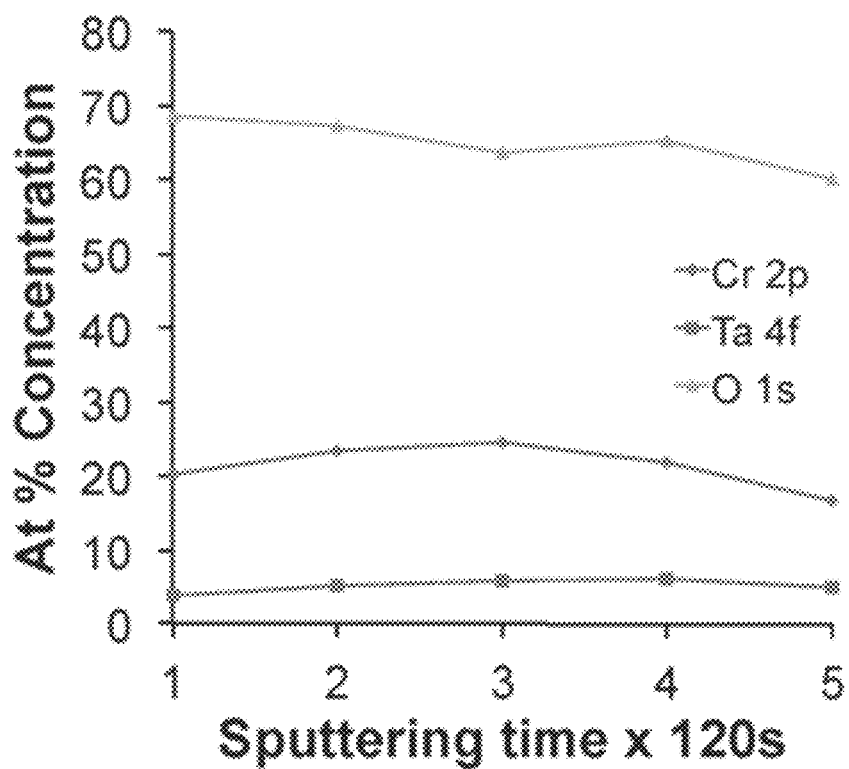
FIG. 14 contains an XPS depth profile analysis showing the presence of both Cr and Ta in oxidized states. Both Ta$_2$O$_5$-[?] and TaO$_2$-[?] are present, with more conductive TaO$_2$-[?] close to the Pt BE and mixture of TaO$_2$-[?] and CrO$_y$ at the Cr/Cu TE.

Material characterization has been carried out to understand the pristine ON state of Pt/TaO$_x$/CrO$_y$/Cr. The X-ray diffraction pattern of FIG. 10 shows peaks from the TE and the Si substrate. The absence of any Ta$_2$O$_5$ or TaO$_2$ peaks indicates that the material is in amorphous state, due to the low deposition temperature. The pristine ON state excludes the conductive filament mechanism and observing the double logarithmic plot of the I-V curve (FIG. 11), quasi-Ohmic regimes with slopes ≈1 are obtained for regions far from the SET condition. Typical trap-assisted Space-Charge-Limited-Conduction (SCLC) is observed close to the SET condition. The SCLC conduction is also observed for Al/TiO$_2$/Al devices (FIG. 12) whose slopes indicate a more abrupt distribution of trap density, which can be related to the different deposition methods. In both devices, the resistive switching mechanism can be attributed to Redox reaction linked with the motion of oxygen-vacancies [5,6]. Moreover, structural modification is observed from the roughness profile of Pt/TaO$_x$/CrO$_y$/Cr cross-point after 100 cycles. As shown in FIG. 13, the Pt/TaO$_x$/CrO$_y$/Cr average roughness (Ra) measured above the TE broadens upon cycling. The Ra changes from a pristine 100 nm variation (FIG. 13-$a$) into a 200 nm broad window (FIG. 13-$b$), indicating structural modification by the motion of oxygen vacancies upon switching. In addition, XPS-depth analysis (FIG. 14) confirms that Ta$_2$O$_{5-}$◻ and TaO$_{2-}$◻ are present, with more conductive TaO$_{2-}$◻ close to the Pt BE and mixture of TaO$_{2-}$◻ and CrO$_y$ at the Cr/Cu TE which is consistent with a Redox switching mechanism.

Multi-Values Programming

Figure 15:
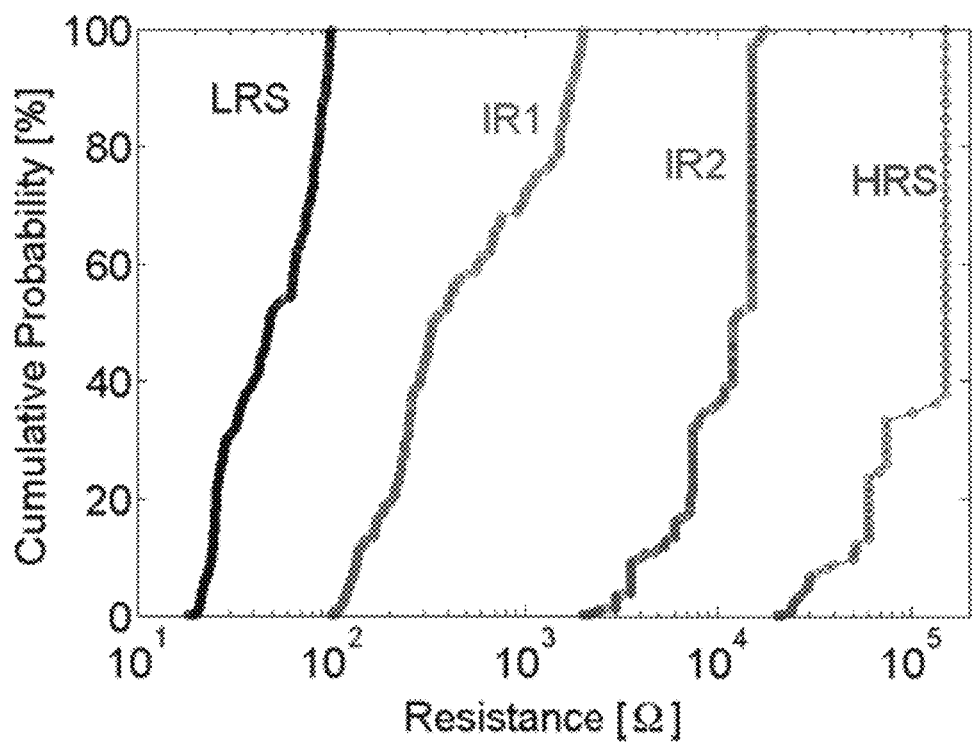
FIG. 15 shows a cumulative probability of Low Resistance State (LRS), Intermediate Resistance states 1 (IR1) and 2 (IR2) and High Resistance State (HRS) for Pt/TaO$_x$/CrO$_y$/Cr devices. The LRS, IR1 and IR2 are obtained by using SET pulses of 2 ms, 1 ms and 500 μs at 1 V, respectively. The HRS is obtained with a 500 μs RESET pulse at −1 V.
Figure 16:
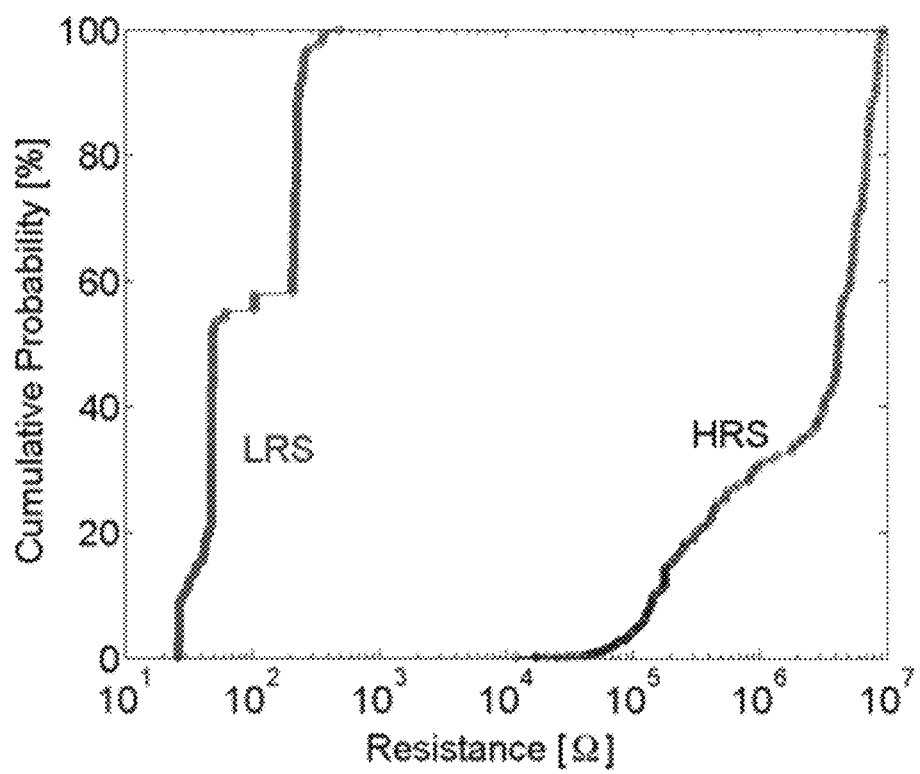
FIG. 16 shows a cumulative probability of LRS and HRS for Al/TiO$_2$/Al devices. The LRS and the HRS are obtained by using SET and RESET pulses of 500 μs at −1 V and +1 V, respectively.
Figure 17:
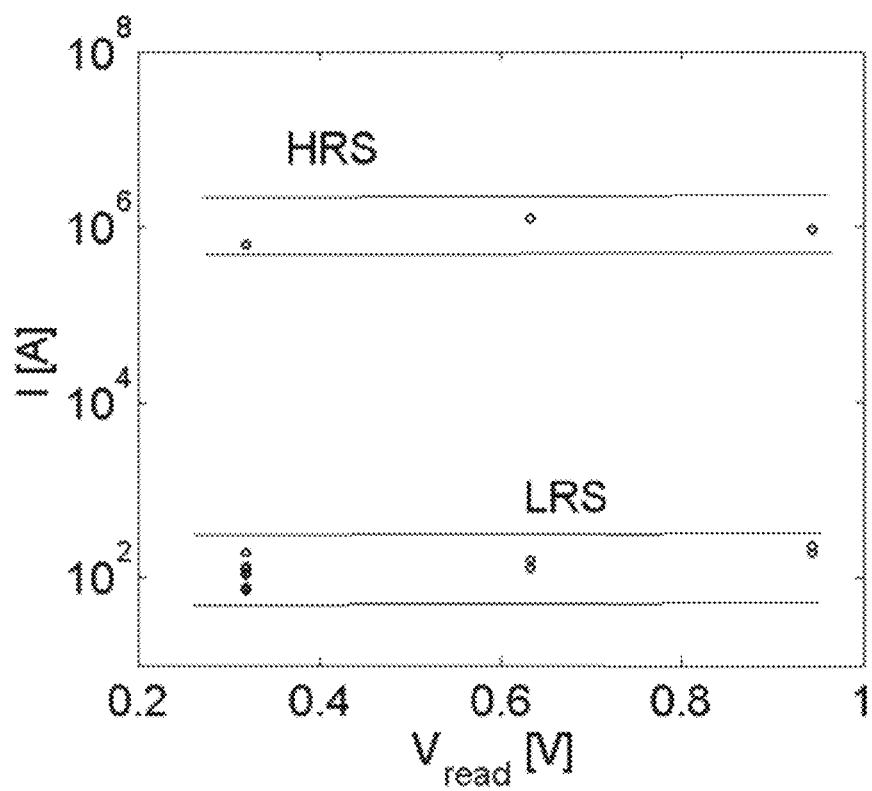
FIG. 17 shows LRS and HRS resistance distributions for increasing $V_{READ}$ of the Al/TiO$_2$/Al cell. The 10$^4$ resistance ratio is constant over a large range of reading voltage.
Figure 18:
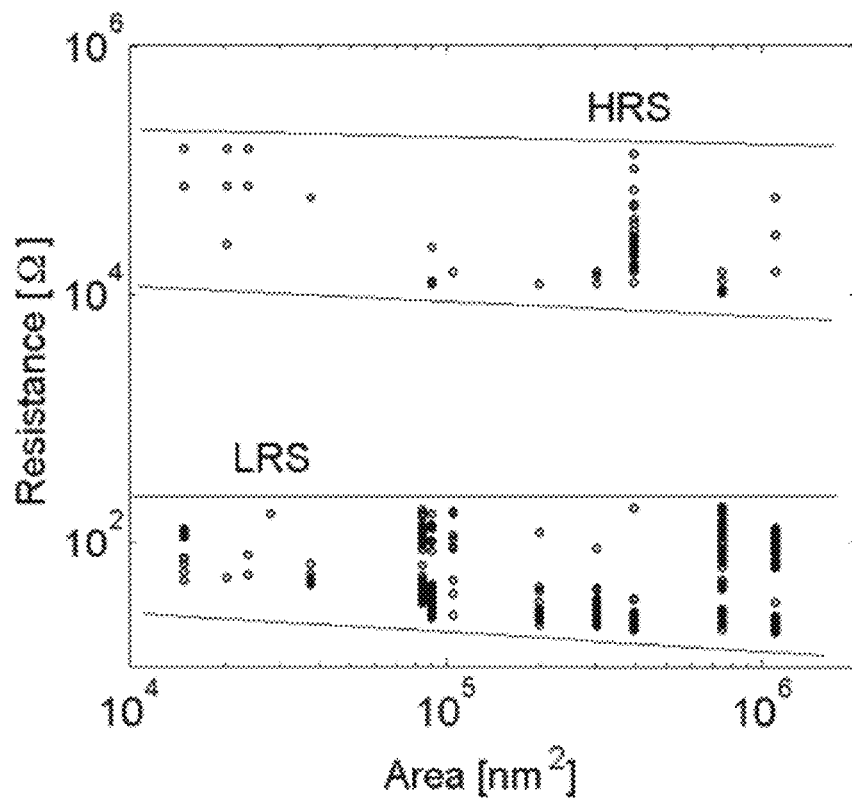
FIG. 18 shows measured HRS and LRS values for the Pt/TaO$_x$/CrO$_y$/Cr cell devices with different cross-point area demonstrating excellent scalability, indicating local switching at the nanoscale.
Figure 19:
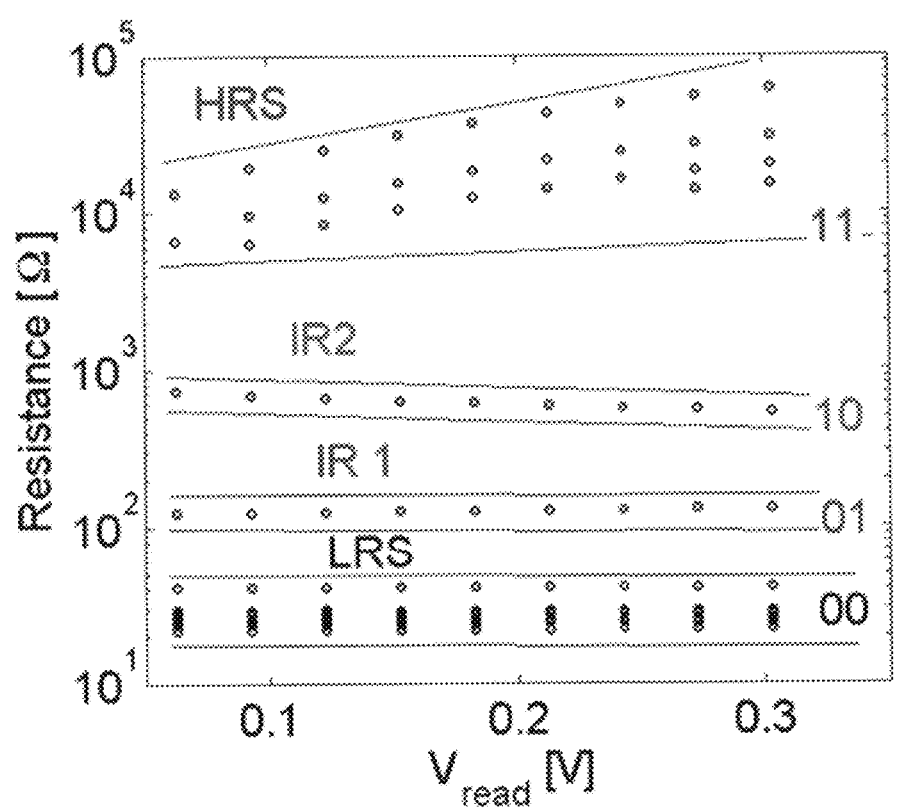
FIG. 19 shows resistance distributions for multi-value storages vs. increasing $V_{READ}$ of the Pt/TaO$_x$/CrO$_y$/Cr cell. The HRS, IR2, IR1, LRS are encoded in 2 bit.

Several resistance levels of Pt/TaO$_x$/CrO$_y$/Cr devices can be programmed. As shown in FIG. 15, four levels of resistance (encoding 2 bit) are found within a 4 orders of magnitude range. A larger resistance window of 1 bit is found for Al/TiO$_2$/Al devices, which show a LRS around 30Ω and a High Resistance State (HRS) at 1 MΩ within 2 orders of magnitude variation (see FIG. 16). The Al/TiO$_2$/Al show stable LRS and HRS in a large V$_{READ}$ voltage range (FIG. 17). The Pt/TaO$_x$/CrO$_y$/Cr devices demonstrate excellent scalability, as the HRS/LRS ratio improves for smaller device sizes (FIG. 18). For instance, 2 bit can be written in a Pt/TaO$_x$/CrO$_y$/Cr by using shorter SET pulses in order to program the cell in one of the stable Intermediate Resistance (IR) states. An example of 2 bit storage using LRS, HRS and 2 IRs is demonstrated in FIG. 19, each level is separated of about one order of magnitude from each other for various V$_{READ}$. The devices could be easily assembled into dense 2.5×10$^9$ bit/cm$^2$ passive crossbar arrays whose storage density improves to 10$^{10}$ bit/cm$^2$ thanks to the capability to store multiple resistive levels of Pt/TaO$_x$/CrO$_y$/Cr RSM devices.

Second Embodiment

Figure 3:
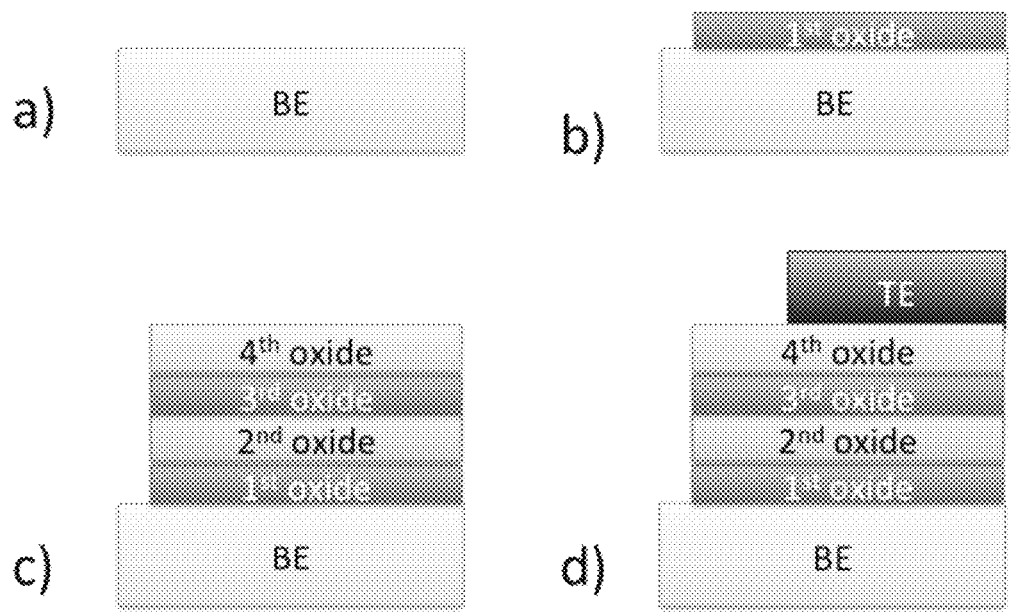
FIG. 3 illustrates an example embodiment of a multiple transition metal oxide layer stack according to the invention.

As a second embodiment, the device consists of a stack including TaO$_x$ and/or CrO$_y$ layers that are inter-mixed or inter-spaced with additional oxide layers made of transitional metal oxides. In this embodiment, a BE is deposited on a substrate (FIG. 3-$a$). Then, a 1$^{st}$ oxide layer is formed on top or around the bottom electrode (FIG. 3-$b$). Then several layers of oxides are formed sequentially on top of the previous oxide layers (FIG. 3-$c$). Finally a TE is deposited on top of the last oxide of the stack (FIG. 3-$d$).

Third Embodiment

Figure 4:
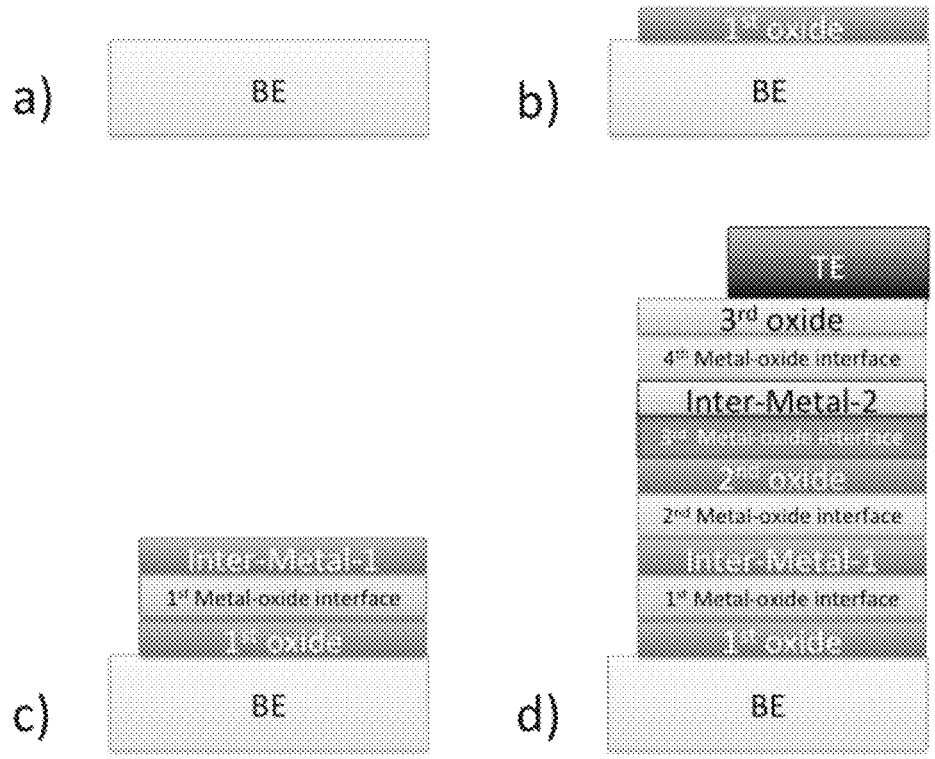
FIG. 4 illustrates an example embodiment of a multiple transition metal oxide and transition metal layers stack according to the invention.

As a third embodiment, the device consists of a stack formed by several layers of transitional metal oxides and metals. In this embodiment, an electrically conductive BE is formed (FIG. 4-$a$). Then, a 1$^{st}$ transition metal oxide layer is formed on top or around the BE (FIG. 4-$b$). After the 1$^{st}$ oxide layer is formed, another transition metal is deposited and an interface with mixture of elements of the 1$^{st}$ oxide and the deposited transition metal is also formed (FIG. 4-$c$). Then another sequence of transition metal oxides and transition metals is formed, such that interfaces of transition metal oxide layers and transition metal layers are formed (FIG. 4-$d$). Finally a TE is deposited on top of the stack (FIG. 4-$d$).

Invention Impact

Perspective Performance

Low voltage operation (1V range): this enables the use of the RSM device into scaled technologies, for which the CMOS circuit cannot operate with voltages larger than 1V.

Multi-value resistive states: this feature improves the number of data stored per RSM device, thus increasing the density of the stored data;

Pristine ON condition: this feature enable to have RSM devices in the low resistive state already after fabrication, thus there is no need of a forming free step with special forming voltages to enable a correct functionality of the RSM device itself.

Forming Free: as per the pristine ON condition, this feature allows to avoid forming operations before the RSM device can be used for the normal operations of writing, reading, etc. . . .

Bipolar Resistive Switching: this feature enables the use of voltages with opposite polarities for SET and RESET operations;

R$_{on}$/R$_{off}$ ratio up to 6 orders of magnitude: the large resistive ratio enables to improve the noise margin for the circuits that are implemented for writing and reading the RSM devices.

Scalability down to 1 nm cross-point: this feature is important to increase density for very advanced technology nodes and it gives perspective for its use in the next decades.

Prospective Applications

FPGAs (forming free, bipolar resistive switching, low voltage, R$_{on}$/R$_{off}$ ratio): In FPGAs, RSM devices can be used as routing resource by employing the resistance into an RSM as a switch. Moreover, two or more bipolar resistive switching RSM devices can be connected in such a way that a complementary resistive switching cell (e.g. GMS) is formed. This is beneficial for efficient programming of the RSM-based routing resources. Similarly, RSM-devices can also be used as standalone memories in FPGAs. The low voltage operation and the high Resistance Ratio enable to scale the technology and to improve noise margins, respectively.

Standalone memories (R$_{on}$/R$_{off}$ ratio, Multi-value, Scalability): a large Resistive ratio enables to improve noise margin, thus relaxing the requirements for the peripheral circuitry needed for the read/write operations in standalone memories. It is important to notice that the scalability and the multi-valued features are extremely important for standalone memories to be competitive.

Dense cross-bars (scalability, multi-value, . . . ); As per the previous application, the scalability and the multi-value features are keys for dense cross-bar applications.

Neural Networks (multi-value, scalability): The RSM-devices can be implemented in neuromorphic circuits in specific blocks. For instance, the RSM can be utilized to emulate the artificial synapse behavior. Due to the requirements of a large number of synaptic interconnections and the capability to store a range of resistance states to express potentiation and/or depression of a synaptic interconnect, multi-value and scalability features are also very important.

General Description of the Memory Structure and Complementary Resistive Programming The development of the memristor enables new possibilities for computation and non-volatile memory storage. The present invention relates to a resistive switching element consisting of two resistive RAM in series connected and to a way of programming the resistance state in each of the two RSMs. We propose a Generic Memory Structure (GMS) and depict its interest for 3D FPGA applications. The GMS cell is demonstrated to be utilized for steering logic useful for multiplexing signals, thus replacing the traditional pass-gates in FPGAs. Moreover, the same GMS cell can be utilized for programmable memories as a replacement for the SRAMs employed in the look-up tables of FPGAs. A fabricated GMS cell is presented and its use in FPGA architecture is demonstrated by the area and delay improvement for several architectural benchmarks.

Architectural Background and Motivation

Figure 20:
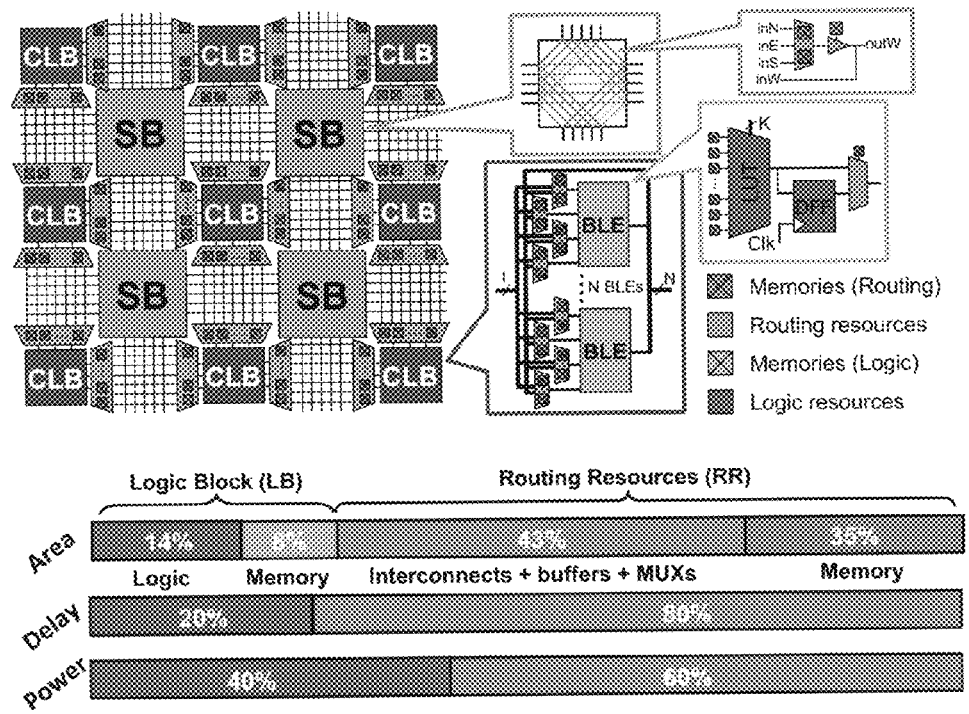
FIG. 20 shows a baseline FPGA architecture [5A] (top) and FPGAs area/delay/power repartition per resources [4A] (bottom)

FPGAs are regular circuits formed by several identical reconfigurable logic blocks called Configurable Logic Blocks (CLBs) that are surrounded by reconfigurable interconnect lines [5A]. As depicted in FIG. 20, every CLB is formed by a set of N Basic Logic Elements (BLEs). A BLE is simply a K-input Look-Up-Table (LUT), whose output can be routed to any other LUT input with or without being saved in a flip-flop. Every CLB has I inputs coming from other CLB outputs. All design parameters N, K and I can be set by the FPGA architect depending on the targeted system granularity.

Programmable interconnections between the different blocks are realized by a massive number of multiplexers configured by memory cells. FIG. 20 depicts also the area/delay/power breakdown of the various components of a baseline SRAM-based island-style FPGA. It is noteworthy that the customizable resources play a major role in FPGA performance, contributing to more than 80% of the total area and delay. For this reason, the FPGA architecture can be improved by working on memories and their efficient use in routing operations.

ReRAM Technology

Many different RSM technologies are currently investigated. In this section, we will draw some generalities and present the fabrication flow.

General Considerations

Oxide memory technologies base their working principle on the change in resistance state due to a modification of the conductivity. Different physical mechanisms can be identified in the switching of RSMs [1A]. In the following, we will focus only on the Bipolar Resistive Switching (BRS) mechanism [2A]. The BRS mechanism is related to the oxygen vacancies redistribution in $TiO_2$ layers upon application of a voltage across the transition metal oxide, causing a resistance change from low to high and vice-versa depending on the voltage polarity. In the following, the electrode on top of the RSM structure is defined as the positive electrode.

Experimental Process Flow

Figure 21:
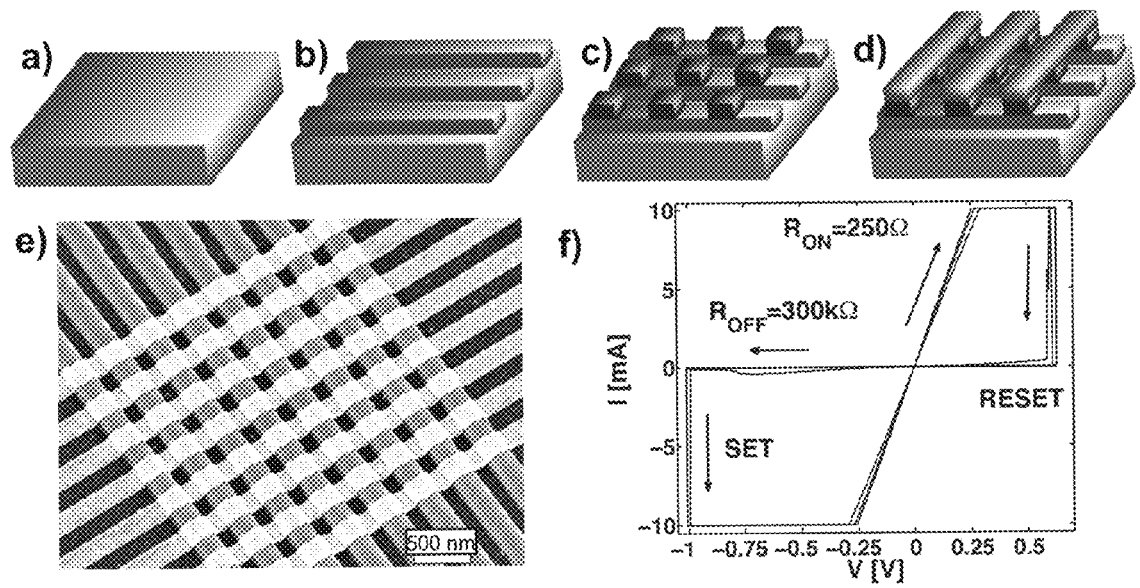
FIG. 21 contains (a) Si wafer coated with 100 nm ALD Al$_2$O$_3$ insulation layer. (b) Horizontal Al metal lines deposited with lift-off defined by e-beam lithography. (c) 10 nm thick TiO$_2$ layer deposited with ALD. (d) Vertical Al metal lines deposited as per (b) forming the top electrodes. (e) A 64-bit crossbar prototype array with 200 nm half-pitch. (f) RSM showing bipolar resistive switching (500 nm half-pitch cell). After the forming process SET and RESET occurs at negative and positive top electrode voltages.

The fabrication flow of the test structures started from bulk-Si wafers passivated by a 100 nm thick $Al_2O_3$ layer deposited by Atomic Layer Deposition (ALD) (FIG. 21-a). Next horizontal 70 nm thick Bottom Electrode (BE) lines were patterned by lift-off and e-beam evaporation (FIG. 21-b). Then, for some devices a 10 nm thick $TiO_2$ layer was deposited with ALD (FIG. 21-c). For other devices a 50 nm thick $TiO_2$ was deposited by reactive sputtering of a Ti target in $O_2/N_2/Ar$ atmosphere at room temperature. Finally, vertical Top Electrode (TE) lines of the crossbar were defined with a second lift-off together with contact areas for electrical characterization (FIG. 21-d). The fabrication method was demonstrated for crossbar arrays with half-pitch down to 100 nm. In FIG. 21-e, a 64-bits crossbar memory cell with 200 nm half-pitch is shown. In Table I several electrode combinations of TE and BE materials are reported.

Experimental Measurements

To achieve consistent BRS, a forming step with low current compliance (<100 µA) was performed. A typical forming voltage above +3.5V was found for a positive TE voltage, while the BE was grounded. Then consistent BRS achieving $R_{ON}$ and $R_{OFF}$ resistive states was measured (FIG. 21-f). Forming operation is not suited for highly distributed memory applications, such as FPGAs. Nevertheless, forming-free RSM-devices can be fabricated by the use of different methods, and in this study the two devices with $TiO_2$ deposited by reactive sputtering switch without the need of a forming step (Table I). This can be attributed to the more defective structure of sputtered $TiO_2$, which typically consists of an heterogeneous mixture of different transition metal oxide phases.

Storage Element Integration Flow

Figure 22:
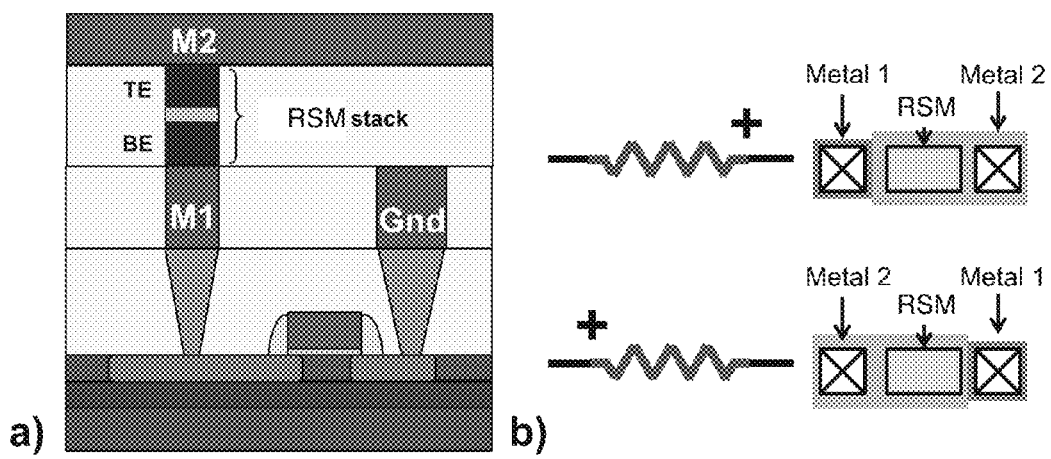
FIG. 22 contains (a) a Cross sectional schematic showing the integration of a RSM device integrated between the M1 and M2 interconnection levels in the back-end-of-line. The bottom electrode is thus directly connected to a MOSFET selector (bottom) forming a 1-Transistor 1-Resistor (1T1R) memory node; (b) RSM device polarity selection by physical design.

One of the big advantages of RSM technology is its CMOS-compatibility. The materials involved in RSMs are deposited at low temperature and can be integrated into the Back-End-of-The-Line (BEoL). As an illustration, a schematic cross section of a co-integrated RSM device in series with a CMOS transistor is shown in FIG. 22-a. As in standalone NOR arrays, illustration includes a storage node and a selector transistor in series in the 1-Transistor 1-Resistor (1T1R) configuration. The memory element may be fabricated either just after the Si contact formation step or after the first steps of interconnections (e.g. on top of Metal 1 interconnect level).

Generic Memory Structure

In order to simplify the programming scheme, a GMS structure consisting of two RSM devices connected in series is introduced.

GMS Concept

As per the previous section, RSMs can be fabricated within the BEoL processing. Hence, it is possible to fabricate them between two metal layers (e.g. in between Metal 1 and Metal 2, as depicted in FIG. 22). Because of the BRS of the RSM devices of this study, depending on the forming polarity, either the Metal 1 or the Metal 2 terminal can be utilized as the positive electrode of the memory, giving two possible configurations (see FIG. 22-b).

Figure 23:
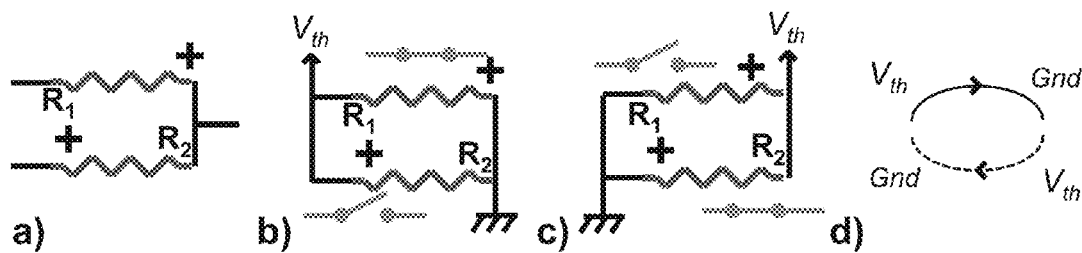
FIG. 23 schematically illustrates GMS complementary programming.

In the GMS, two RSM devices are interconnected as shown in FIG. 23-a. The positive terminal of the top device is connected to the negative terminal of the bottom device. This arrangement enables complementary programming of the two RSM devices composing a GMS. We call the concurrent programming of the GMS a complementary programming operation. A similar programming scheme was previously used for low power crossbars [12A]. FIG. 23-b illustrates the programming of the top path (i.e. left to right arrow in the programming graph shown in FIG. 23-d). $R_1$ and $R_2$ are switched simultaneously to $R_{OFF}$ and to $R_{ON}$ respectively. This operation is achieved by grounding the common right terminal and biasing the left terminal to $V_{th}$ (which corresponds to the SET voltage $-V_{th}$ for $R_1$ and to the RESET voltage $+V_{th}$ for $R_2$). Programming the bottom path (see FIG. 23-c) is done by inverting $V_{th}$ and Gnd (which corresponds to the RESET voltage for $R_1$ and to the SET voltage for $R_2$). In addition to increasing the programming speed, only two voltages are needed (Gnd and $V_{th}$), thanks to the complementary scheme.

Experimental Validation

The complementary programming operation has been validated by electrical measurements, while the MUX performances have been extracted by electrical simulations.

Figure 24:
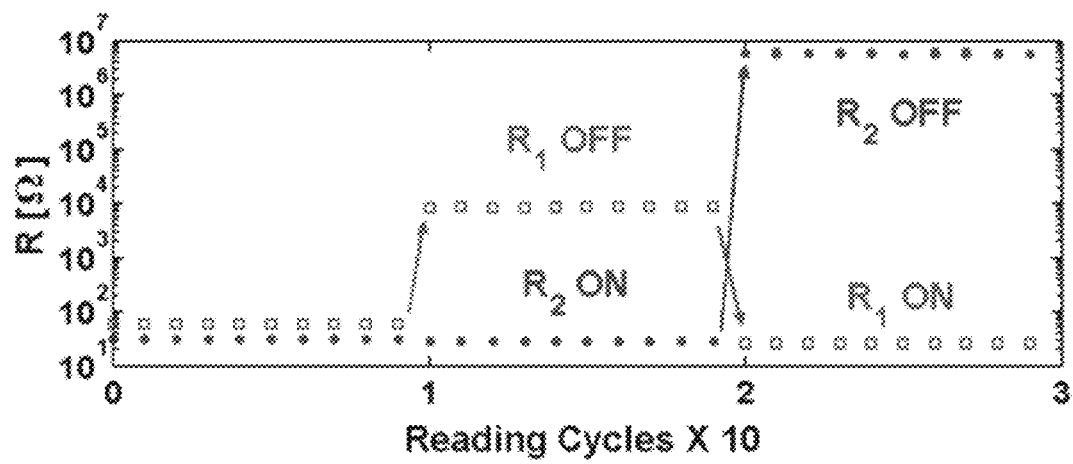
FIG. 24 contains a graph showing complementary switching operation for the RSM-based GMS.

FIG. 24 depicts the resistance values of $R_1$ and $R_2$ of an GMS-based MUX21. Resistances are read at $V_{READ}=+0.1V$.

After a preliminary forming step, $R_1$ and $R_2$ are set to $R_{ON}$. The devices are then read for 10 cycles, showing a stable non-volatile resistance. Hence $R_1$ and $R_2$ are switched using the complementary programming operation presented in the previous section. During the first write operation SET and RESET events are induced on $R_2$ and $R_1$, respectively (see FIG. 23-c) by applying a voltage pulse for 500 µs. After reading the resistance values for another 10 cycles, again validating the non-volatility of the resistance states, a second complementary switching operation is performed as depicted in FIG. 23-b. Now the resistance states of $R_1$ and $R_2$ switch complementary, as seen in the reading sequence of FIG. 24. Note that the resistance values of $R_1$ and $R_2$ do not exactly match. This is due to the different RSM device geometries and to the large variability of the cells utilized for the demonstrator. Nevertheless, improved variability of one order of magnitude has been demonstrated for RSM device prototypes fabricated with industrial methods [2A].

GMS-Based FPGA Design

In this section, the operation of a novel multiplexer design and a configuration memory based on GMS is discussed.

GMS-Based Multiplexer: Overall Structure

Figure 25:
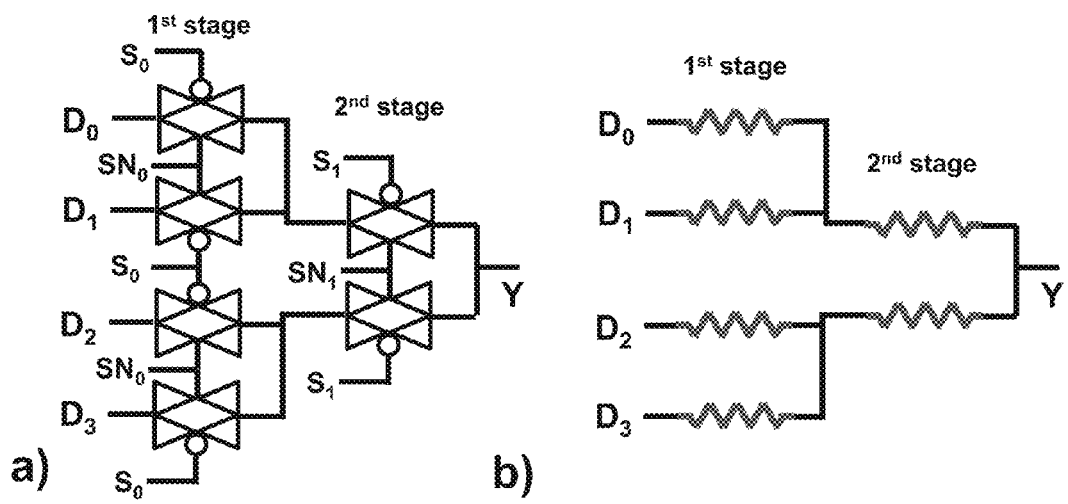
FIG. 25 illustrates 4 to 1 multiplexers based on (a) pass-gates and (b) ReRAMs.

FIG. 25-a illustrates a 4 to 1 MUX based on CMOS transmission-gates arranged in two cascaded stages. In this MUX, a unique path is configured between an input $D_X$ and the output Y. The path is selected by the signals $S_X$. Adjacent paths are complementary addressed by inverted signals $SN_X$. The selection signals are permanently driven to ensure a constant path selection. Inspired by this structure, the RSM-based MUX (depicted in FIG. 25-b) uses the unique low on-resistance property of the RSM-devices to operate as high-performance non-volatile switches. Thus, it is possible to replace the transistor-based pass-gates by the RSM-devices to obtain a non-volatile MUX. The path selection operation is achieved by programming to low resistance state all the individual memories that belong to the desired path. The others paths are deselected by programming their memories to high resistance state.

GMS-Based Multiplexer: Configuring the MUX Network

Figure 26:
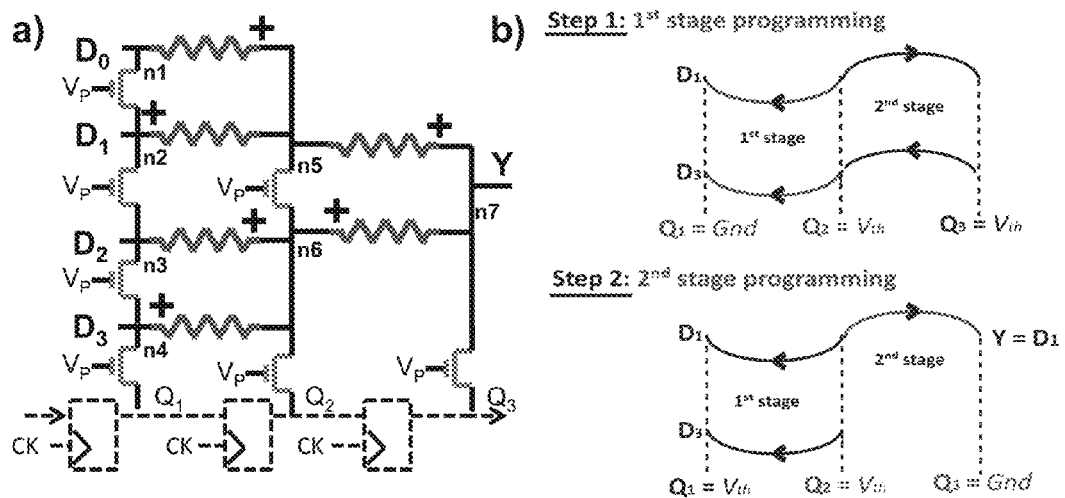
FIG. 26 illustrates (a) 4 to 1 multiplexer with programming circuits and (b) associated programming diagram to configure output to input D1.

For each RSM-device composing the MUX structure, a high- or a low-resistive state must be programmed. This individual selection and write operation leads to an increase in the programming complexity. In order to simplify this, a complementary programming scheme for the RSM-device network is proposed here. Complementary programming is explained for a 4 to 1 MUX, however it can be generalized to a generic MUX. A two stage 4 to 1 MUX and its programming circuit are shown in FIG. 26-a. By enabling the $V_P$ signal ($V_P=1$), all the input and output nodes of stage i are shorted to the output of the configuration flip-flops $Q_i$ and $Q_{i+1}$ respectively. In the example of the FIG. 26, nodes n1 to n4, n5 and n6, and n7 are connected to $Q_1$, $Q_2$, and $Q_3$ respectively. In order to avoid cross programming between different stages, each stage is configured sequentially. Hence, for a two stage MUX network, we need two steps for configuring a unique path. As an example, we illustrate the two steps required to configure the path connecting input $D_1$ to the output Y. All the configuration transistors are first turned Off ($V_P=0$). A set of digital logic levels is then serially fed to the shift register. Voltages are chosen to configure the stage in the desired state without interfering with the other stages. FIG. 26-b presents the configuration scheme for programming the two stages sequentially. In the first step (Step 1), the first stage is configured to enable the RSM-device connected to the input $D_1$. This is achieved by applying $Q_1$=Gnd and $Q_2=V_{th}$. Programming of the successive stages is disabled by applying the same voltage at $Q_2$, to the upstream stages (i.e., $Q_3=V_{th}$). It has to be noted that with this operation also the RSM-device connected to the input $D_3$ is enabled. After storing the desired voltages in the registers, the configuration transistors are turned On ($V_P=1$) and the basic elements of the stage are programmed in the desired state. After the RSM-device programming, all the configuration transistors are turned Off. In the next step, the procedure is repeated for the second stage, which is configured by enabling the RSM-device path between nodes n5 and n7. This is achieved by applying $Q_2=V_{th}$ and $Q_3$=Gnd. At this point, the first stage is kept static, without any programming, by applying the same voltage as $Q_2$, to the downstream stages (i.e., $Q_1=V_{th}$).

GMS-Based Configuration Memory

In this section, we present an elementary circuit used to move most of the configuration part of reprogrammable circuits to the fabrication back-end, reducing their impact on fabrication front-end occupancy. Such a memory node is dedicated to drive LUT inputs. The memory node is based on a unique GMS node and provides intrinsically the retained information as a voltage level. Furthermore, it allows an efficient layout by sharing lines.

GMS-Based Configuration Memory: Overall Structure

Figure 27:
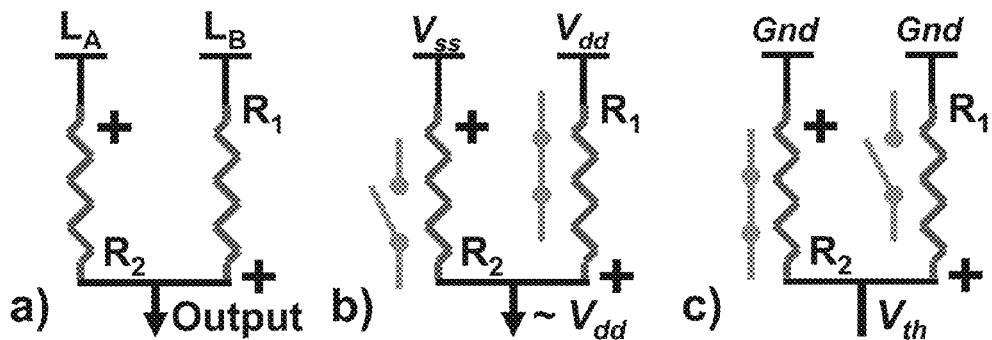
FIG. 27 shows (a) RSM-based memory node; (b) Node in read configuration; and (c) Node in write configuration.

The basic memory node is presented in FIG. 27-a. The circuit consists of 2 RSM-devices connected in a voltage divider configuration between 2 fixed voltage lines ($L_A$ and $L_B$). The memories are operated in a complementary manner, in order to improve reliability. The output is designed to place a fixed voltage on a conventional standard cell input. Read operations are intrinsic with the structure, while programming is an external operation to perform on the cell.

GMS-Based Configuration Memory: Read Operation

A voltage divider is implemented in this topology to intrinsically realize the conversion from a bit of data stored as resistance level to a voltage level. FIG. 27-b presents a configuration example where the node stores a '1'. Voltage lines $L_A$ and $L_B$ are respectively connected to $V_{ss}$ and $V_{dd}$. For the sake of illustration, consider that the resistive memory $R_1$, connected to the $V_{dd}$ line, is configured to the low resistivity state. The other memory $R_2$, connected to $V_{ss}$, is in the high resistivity state. As a consequence, a voltage divider is configured and the output node is charged close to the voltage of the branch with a high conductivity. The logic levels depend on $R_{ON}$ and $R_{OFF}$ as per the voltage divider structure.

It is also worth noticing that in continuous read operation, a current will be established through the resistors. This leads to a passive current consumption through the structure, which is highly dependent on $R_{OFF}$. This static current can be reduced by the choice of a memory technology like $Cu/TiO_2/Pt$ (Table I) maximizing the $R_{OFF}$ value, without any impact on the speed. Indeed, the configuration memories are not directly related to the data path and only drive static nodes.

GMS-Based Configuration Memory: Write Operation

Figure 28:
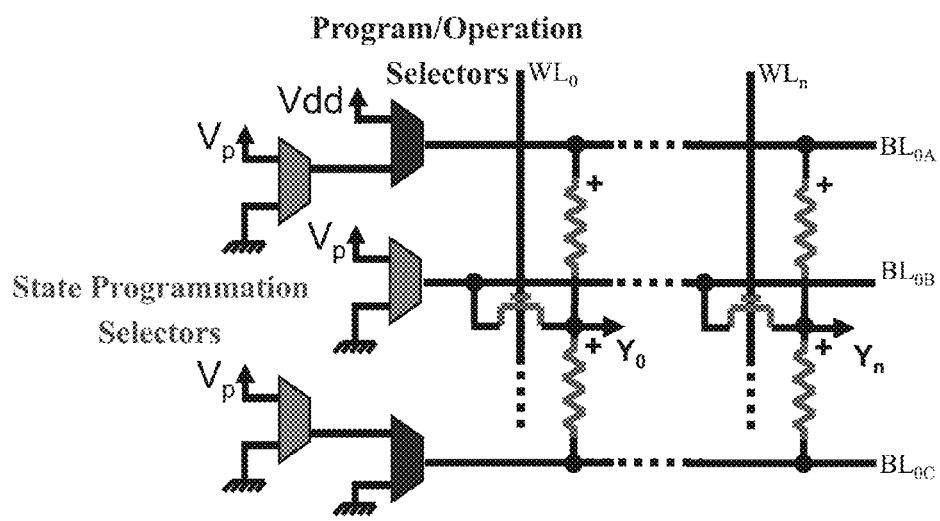
FIG. 28 contains a line sharing illustration in standalone-memory-like architecture.

FIG. 27-c presents the programming phase of the node. First, the lines $L_A$ and $L_B$ are disconnected from the power lines and connected to the programming signals. The programming signals are chosen according to the GMS programming scheme. FIG. 28 presents the programming circuits required to program an array of GMS-based configuration memories. To provide individual access, each GMS has its own selection transistor. Thus, the different lines can be shared in a standalone-memory-type architecture, yielding a more efficient layout. The different modes and programming signals are selected by line-driving MUXs.

Performance Characterization

In this section, evaluation of the GMS-based FPGA elementary blocks is proposed at the circuit level. The study focuses on the block-level metrics such as area, programming time and energy.

Methodology

To validate the RSM-based building blocks, we characterized their performances metrics in terms of area and write time. The performance extraction is based on the node complexity expressed in terms of the basic elements that are required to realize the circuit. The area is extracted from basic layout considerations using CMOS 45-nm technology rules [13A] and expressed in half-pitch to give values independent of lithography node. Timing and energy numbers are extracted from the ITRS [14A]. Comparison with building blocks traditionally used in FPGA, such as CMOS SRAM 5T cells [5A] and Flash memory elements [6A], are then used to evaluate the structures. The associated numbers are also extrapolated from the ITRS [14A]. Note that we are dealing with non-volatile memories. Hence, we will stress the comparison with regards to Flash.

Memory Performance Characterization

Table II shows some characterization results in terms of area, write time and programming energy for the proposed solution and traditional FPGA memory nodes. Note that this comparison only considers the storage node itself and is not including all the external programming circuitry. We observe that the proposed RSM-device is the most compact solution with a gain of 3× compared to Flash, even with the impact of the programming current on the access transistor. This advantage is due to the reduction of the memory front-end footprint to only one transistor, compared to 5 for the SRAM cell and 2 for the Flash solution (one pull-up transistor coupled to a floating gate transistor). In addition, RSM-devices offer a significant writing time and programming energy reduction for non-volatile memory technologies of 16× and 8× respectively. Finally, note that the leakage power depends mainly on the material. Materials with a high $R_{OFF}$ should be privileged for low power operation. Indeed, $Cu/TiO_2/Pt$ demonstrates a gain of 2 orders of magnitude compared to SRAMs.

Data Path Impact Characterization

Figure 29:
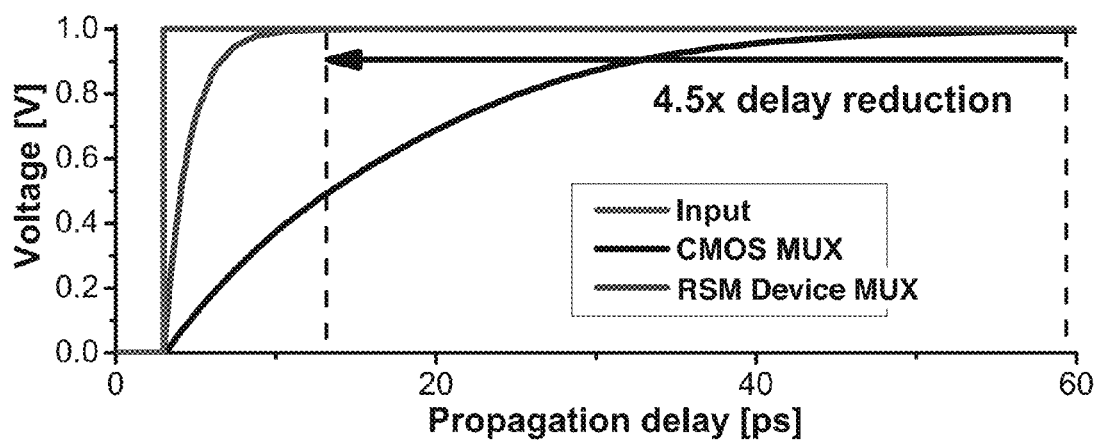
FIG. 29 contains a graph showing an electrical simulation of a GMS-based 2 to 1 MUX timing response.

FIG. 29 depicts the timing response of the 2 to 1 basic multiplexer. The elementary multiplexer structure is build with a unique $Pt/TiO_2/Pt$-based GMS. The timing response was obtained by electrical simulation and compared to a CMOS equivalent counterpart built in 45 nm technology [13A]. We observe a timing improvement of 4.5 times as compared to CMOS. This remarkable delay reduction is due to the low on-resistance of the ReRAM technologies. For instance, at 45 nm the internal resistance of an n-type transistor is 3.8 kΩ (minimal size transistor extracted from 45 nm design kit [13A]), while the RSM technology exhibits an on-resistance of hundreds of Ohms. Note that, in the proposed MUX design, the programming circuits are not related to the data path. Thus, only the RSM parameters impact the electrical performance. Finally, as the memories are directly used to perform the routing operation, no leakage power is dissipated by the MUX (i.e. no permanent leakage path exist in the structure), offering significant interest for power reduction.

Architectural Impact

The demonstrated structure introduces compact RSM-devices with low on-resistance in the data paths of the FPGAs. In this section, we will study the impact of the structure on an architectural perspective.

Methodology

A set of logic circuits taken from the MCNC benchmark were used, which have been synthesized using ABC [15A]. The technology mapping was then performed with a library of 4-input LUTs (K=4) using ABC as well. Subsequently, the logic packing of the mapped circuit into CLBs was done with N=10 BLEs per CLB and I=22 external inputs using AA-PACK [16A]. Finally, the placement and routing were carried out using VPR6.0 [16A]. Each benchmark was first synthesized on an SRAM-based FPGA in the CMOS 45 nm process [13A]. Then, the SRAM-based MUXs were replaced by their RSM-device counterparts ($Pt/TiO_2/Pt$). The impact of the circuits needed for the programming is taken into account for the evaluations.

Simulation Results

Figure 30:
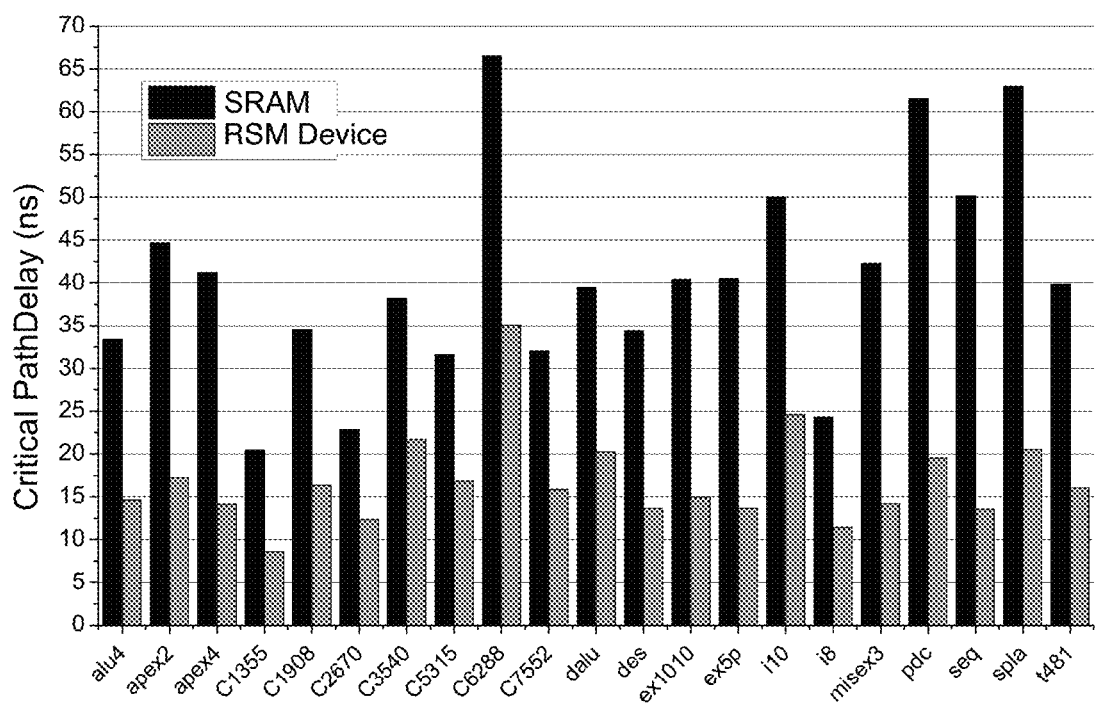
FIG. 30 contains a bar graph illustrating delay estimation for FPGAs synthesized with ReRAM- and SRAM-based multiplexers.

The benchmarks were mapped in CMOS SRAM-based and RSM-based FPGAs. The critical path delay estimation is shown in FIG. 30. The benchmarks showed an area reduction ranging from 4% to 8%, with 7% on average, coming from a slight reduction of the silicon surface occupied by the routing resources. Note that the complete set of programming resources have been considered. The simulations showed a critical path delay reduction ranging from 43% to 73%, with 58% on average. The reduction is the direct impact of the high performances MUXs, introduced throughout the data path. This makes the RSM-based FPGA potentially faster than the SRAM-based counterparts. In addition, the leakage power of the CLBs is reduced by 10%, thanks to in-existence of leakage current in the MUX structure.

Discussions

The bipolar resistive switching RSM-devices presented in this description have been fabricated and electrically characterized in terms of $R_{ON}/R_{OFF}$ ratio and read/write voltages for a different combination of metal electrodes with sputtered or ALD deposition of $TiO_2$. As reported in Table I, the cells with sputtered $TiO_2$ are the only ones showing resistive switching without the need of a forming step. RSM-devices made of Pt/sputtered $TiO_2$/Pt has been chosen to carry out the architectural simulations for FPGA because of a better $R_{ON}/R_{OFF}$ ratio and the compatibility with a ±2 V programming voltages. The GMS cells are utilized to replace SRAM LUTs in FPGAs in a more compact way because RSM-devices are implemented into the BEoL. Moreover, the complementary switching mechanism of the GMS cells is utilized also as steering logic. In particular, the low $R_{ON}$ memories improve the delay in the data paths of FPGAs. Last but not least, RSM-devices can be built in different flavors, depending on the objectives in terms of delay and power trade-off. For instance, the Cu/sputtered $TiO_2$/Pt RSM-device of Table I can be exploited for its large $R_{OFF}$. Such a material leads to a reduction of the CLB static power consumption of up to 69% compared to SRAM FPGAs.

Prospective Applications

Reconfigurable Logic (FPGA/CPLD/PLA/NoCs, . . . ): logic gates can be routed and the routing can be programmed by a network of GMS cells to program a circuit to provide a specific logic function;

stand-Alone Memories: use of the GMS structure as a unique memory node to reduce the leakage and simplify the read/write thanks to unbalanced flip-flops.

General Description of the Read/Write Circuitry

The present invention encompasses, among other objects, a read/write CMOS circuitry optimized for the read/write operations of RSM arrays implementing a dedicated read/write protocol.

The present invention gives the method/s of novel read/write circuitry of the resistive memory array cells that requires no pass transistor processed underneath each of the memory array cell to select the memory cell in order to perform read or write operation on the selected cell. In order to exploit the functionality of the RSM, the RSM is connected between two conductive electrodes, usually referred as the Top Electrode (TE) and the Bottom Electrode (BE), forming an RSM device. Moreover, in Very-Large-Scale of Integration (VLSI) circuit design, it is highly desirable to have RSM devices implemented in very dense arrays, thus forming dense arrays of RSM devices arrays.

The present invention further provides a method of integration of RSM devices arrays on top of CMOS circuitry by post-processing the same CMOS die where the read/write circuit has been first fabricated. In one embodiment, the method includes the design of the RSM device to be utilized in the RSM device array integration. In another embodiment, the method includes the design of the BEoL such that it does not require additional masks to pattern VIA, electrodes and resistive switching materials but only micro-fabrication post-processing steps. In another embodiment, the method of integration utilizes one or more masks to define the area of the BEoL where the RSM device arrays are designed to be performed. In another embodiment, the method of integration utilizes both the features designed in the BEoL and additional masks to fabricate RSM device arrays.

The invention herein described thus provides a unique combination, specifically with respect to the following points:
1. Digital circuit design for the implementation of a dedicated read/write protocol for RSM memory arrays;
2. Analog circuit design; and
3. CMOS BEoL compatible post-processing of the CMOS chip and arrays of RSM devices integrated by such post-processing.

Preferred Embodiments

The development of a process flow compatible with CMOS Back-End-of-Line is fundamental for providing large access to this novel technology with a limited development costs. The main objective is to develop some integration techniques that allow to efficiently implement arrays of RSM devices on top of dies, processed by conventional CMOS foundries.

One of the big advantages of the RSM technology is its CMOS-compatibility. Indeed, the materials involved in RSM devices can be deposited at low temperatures, compatible with metal line microfabrication processes (e.g. BEoL). Different integration options might then be envisaged according to a specific RSM device.

FIRST EXAMPLE

Read Circuitry—Method I

Figure 31:
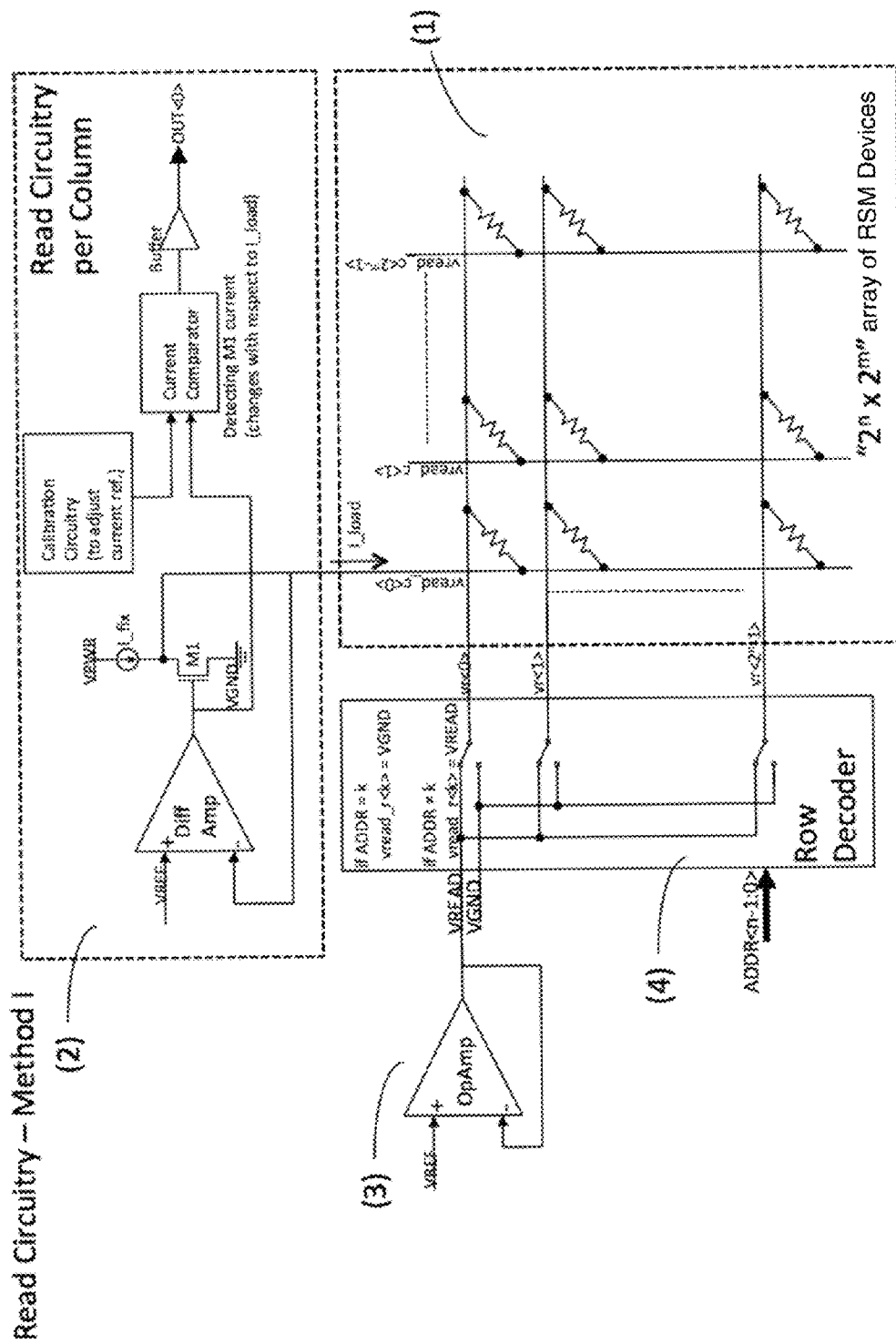
FIG. 31 illustrates one of the read operation method over $2^n \times 2^m$ RSM stack array cells (1), according to a preferred embodiment of the invention.

The read circuitry shown in (2) in FIG. 31 needs to be implemented for each of the column cells. Each column voltage level is set by the VREF voltage through the differential amplifier with high gain. And each row voltage level except the row to be read is set to VREF through the circuitry marked as (3) and through the row decoder marked as (4). The selected row voltage level is set to VGND (ground). As the resistive array cell content is changed from low resistor value (RL) to high resistor value (RH), the current from the resistive array cell (I_load) changes from VREF/RL to VREF/RH. Therefore the current on M1 transistor in (2) changes from "I_fix-VREF/RL" to "I_fix-VREF/RH". This current change detected in the "Current Comparator" in (2) that generates OUT<k> as "Low Voltage Level" if the resistive cell content is "RL" or "High Voltage Level" if the resistive cell content is "RH". In other examples, Current Comparator can be designed in such a way that OUT<k> will be at "High Voltage Level" if the resistive cell content is "RL" or "Low Voltage Level" if the resistive cell content is "RH". Calibration circuitry in (2) is considered to adjust the current reference to compensate process/temperature and voltage variations on each of the elements shown in FIG. 31.

SECOND EXAMPLE

Read Circuitry—Method II

Figure 32:
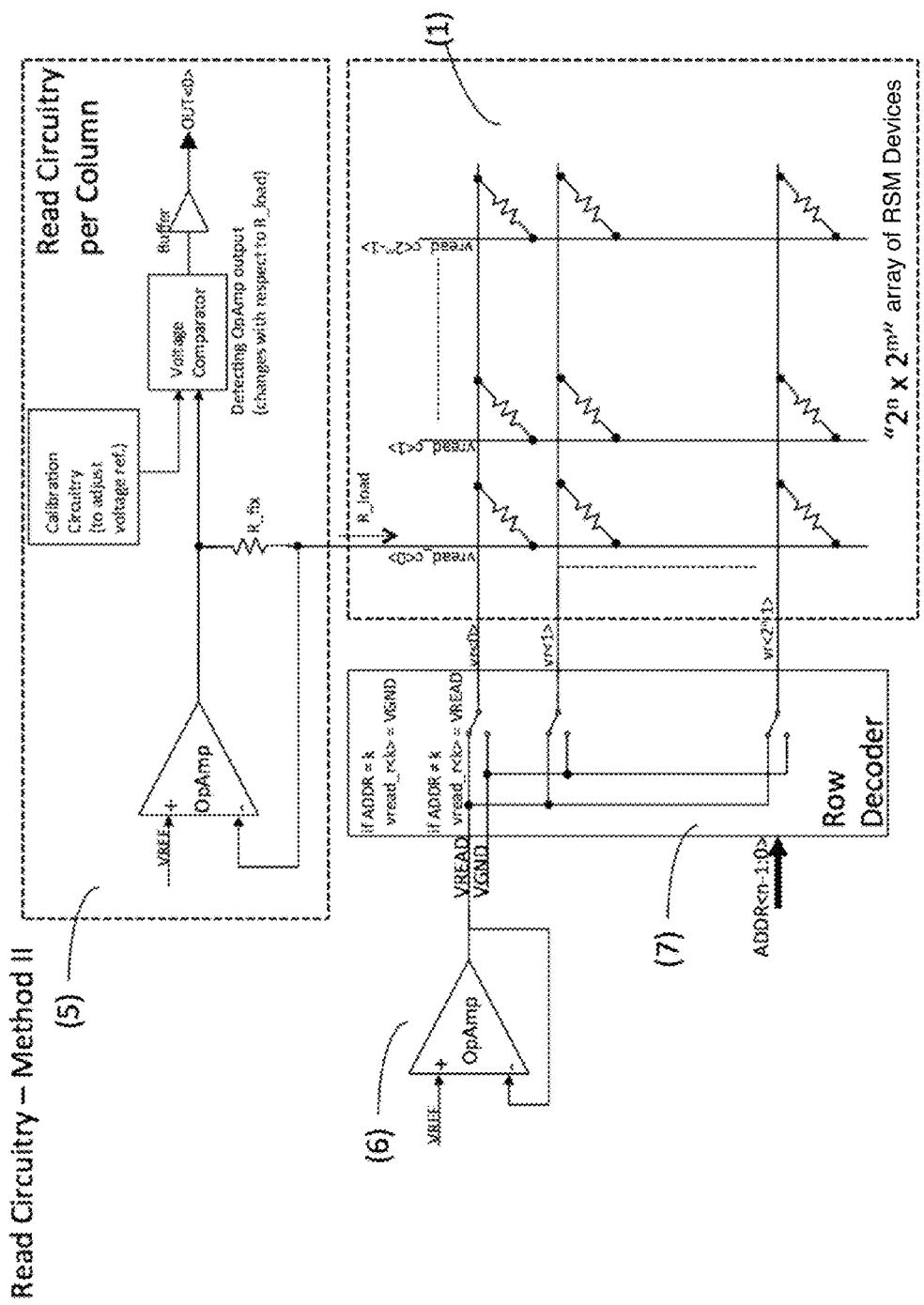
FIG. 32 illustrates another method of the read operation over $2^n \times 2^m$ RSM stack array (1), according to a preferred embodiment of the invention.
Figure 33:
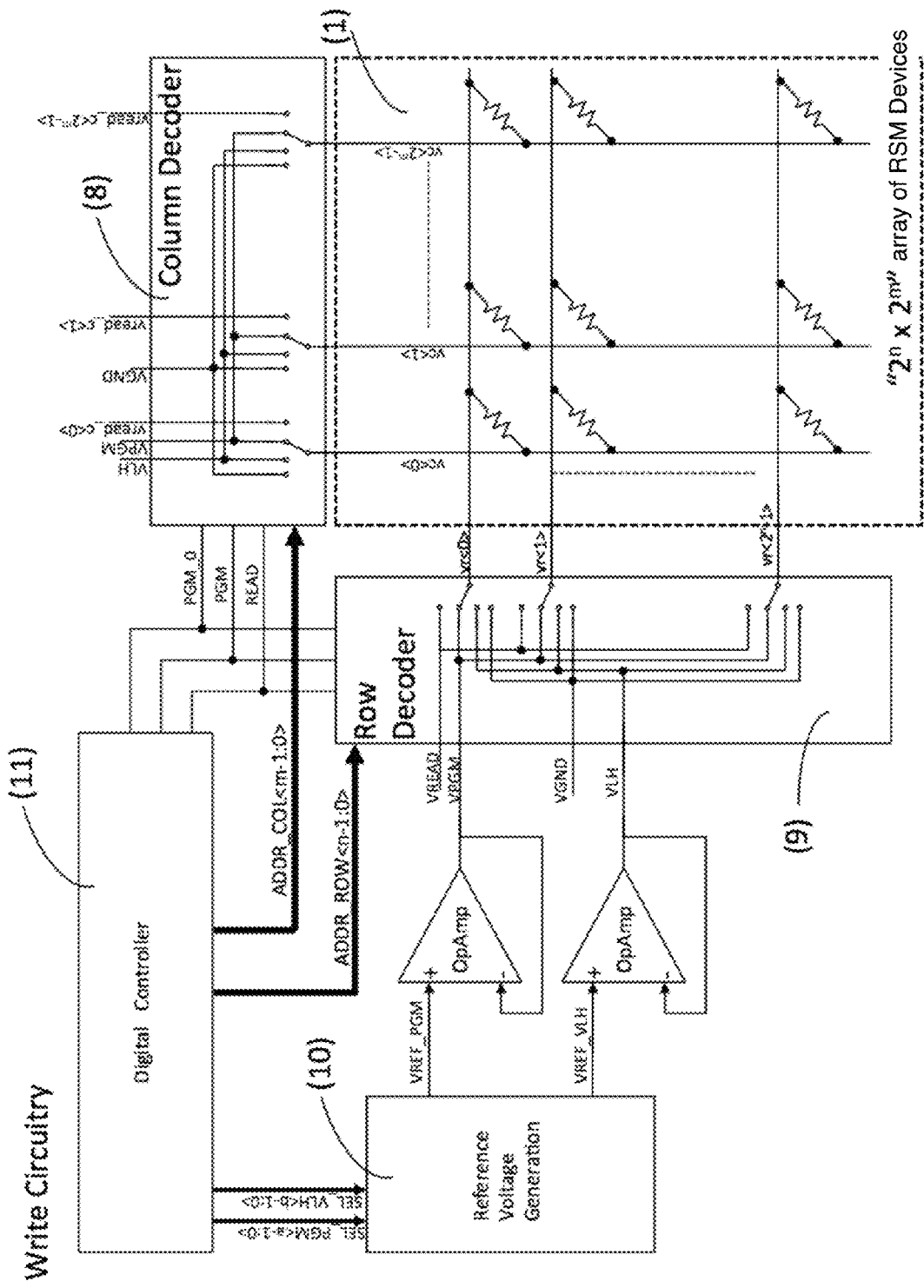
FIG. 33 shows the write operation over $2^n \times 2^m$ RSM stack array (1), according to a preferred embodiment of the invention.
Figure 34:
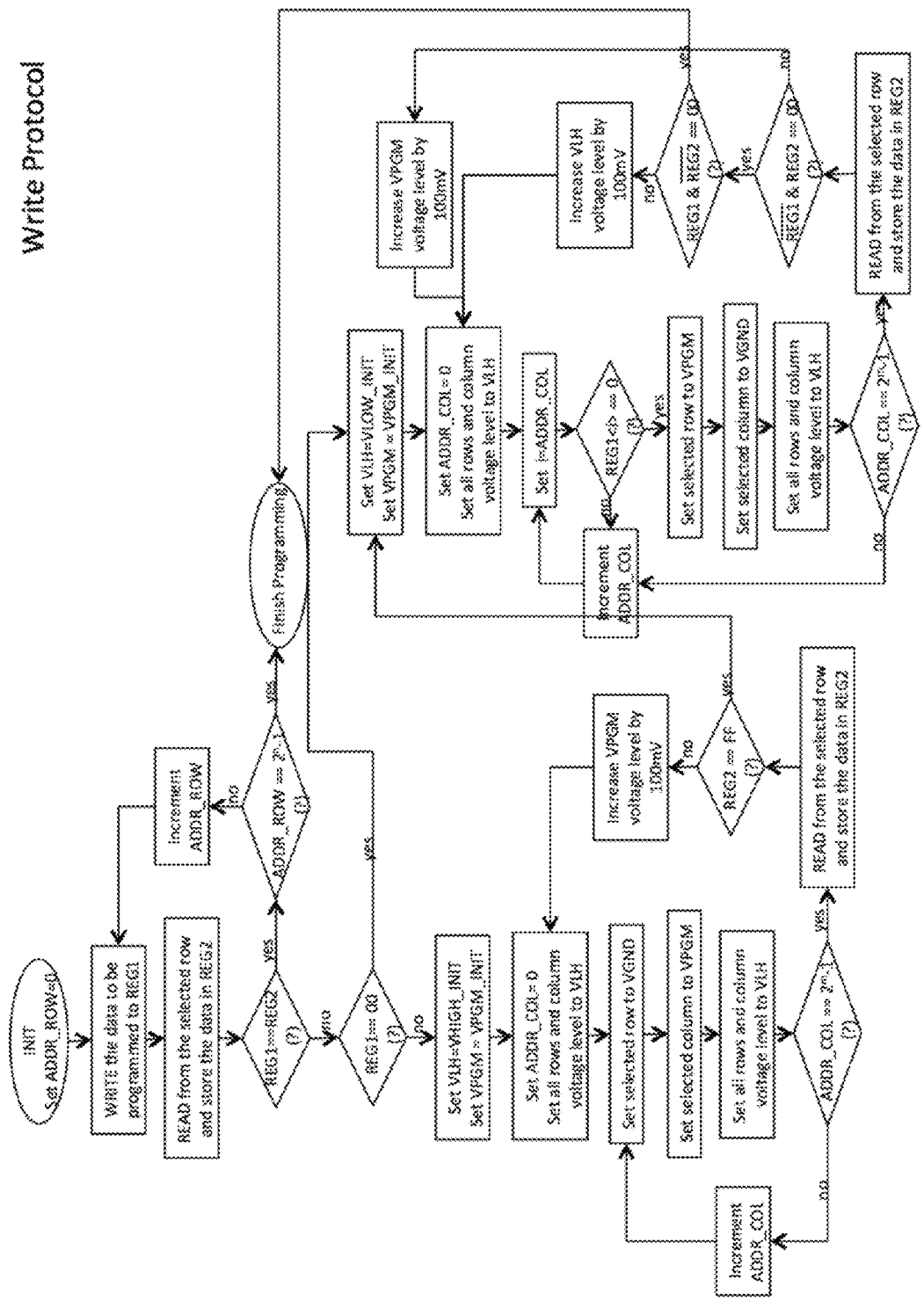
FIG. 34 illustrates the writing protocol in order to control VPGM and VLH voltage levels, according to a preferred embodiment of the invention.

As the selected resistive ram cell content is changed from RL to RH, the output voltage of the opamp in FIG. 32 changes from VREF×(R_fix+RL)/RL to VREF×(R_fix+RH)/RH. Considering R_fix equal to RL and RL=~RH/10, output voltage of the opamp changes from 2×VREF to ~1.1VREF. Voltage comparator converts this variation to "Low Voltage Level" or "High Voltage Level" depending on the resistive ram cell content. Calibration circuitry in (5) is considered to adjust the voltage reference to compensate process/temperature and voltage variations on each of the elements shown in FIG. 32.

THIRD EXAMPLE

Write Circuitry

To program "high resistive value—RH" or "low resistive value—RL" on a selected row and selected column, VPGM voltage drop needs to be applied across the resistive ram cell. Depending on the polarity of VPGM, the cell content data can be either RL or RH, e.g. applying VPGM to ROW and VGND to column programs the cell content as RH, applying VGND to ROW and VPGM to column programs the cell content as RL, or vice versa. In order to keep other resistive array cells' value not changed, the voltage drop across each of the un-selected cells needs to be kept less than "VPGM-⊗ V". In order to set the voltage levels accordingly, reference voltage generation block (10) and digital controller (11) is designed to get the proper VPGM voltage level and proper VLH level by adjusting ⊗ V. It is essential to write the entire RSM element with minimum ⊗ V in order to limit the current consumption over each row and column. During write operation, all un-selected rows' and columns' voltage level is set to VLH level.

FOURTH EXAMPLE

Writing Protocol

Here after follows a pseudo-code description of the writing protocol that is described regarding to below assumptions and examples.
RAM Size: N×M (e.g. 128×8)
N: number of rows
M: number of columns
VPGM: Programming voltage
VLH: Maximum (or minimum) voltage level that will not change the cell content
Assumption 1: Applying "VPGM to column" and "VGND to row" changes the content of the cell to "RH". In this case VLH is close to "VPGM"
Assumption 2: Applying "VGND to column" and "VPGM to row" changes the content of the cell to "RL". In this case VLH is close to "VGND"
Logic "0": RL
Logic "1": RH For instance, N: 128, M: 8, VPGM=1V, VLH=900 mV and RL=10 KΩ
If only one cell is written on the selected row:
max peak row current for the worst case condition=VPGM/RL=100μA
max peak column current for the worst case condition= (VPGM−VLH)×(N−1)/RL+VPGM/RL=10 μA×127+ 100μA=1370 μA
If all cells are written simultaneously on the selected row:
max peak row current for the worst case condition=VPGM× M/RL=800 μA
max peak column current for the worst case condition= (VPGM−VLH)×(N−1)/RL+VPGM/RL=1370 μA 1. Assign the data to be written to an 8-bit register (REG1)
2. READ from the selected row and assign the read-data to another 8-bit register (REG2).
   i. While Reading, set each un-selected row to "VREF" voltage of the OpAmp connected to the columns as in (3) and (6) of FIG. 31 and FIG. 32
   ii. Set selected row to "VGND"
3. COMPARE the data in REG1 and REG2. If they don't match, start the WRITE operation. If they matches, select the next row and repeat the step 2 and step 3.
4. If REG1 content is not equal to "hex00" then WRITE the content of the selected row to "hexFF" and go to step 5. If it is equal to "hex00" then go to step 8 to perform WRITE operation of logic 0s (RLs).
5. WRITE Operation of hexFF on the selected row by selecting each column individually
   i. Set VLH and VPGM voltage levels to their initial voltage levels (e.g. 0.9V and 1V)
   ii. Set all rows and columns to "VLH".
   iii. Set selected row to "VGND=0V"
   iv. Set selected column to be written to "VPGM"
   v. Worst case peak current calculation (assuming VPGM=1V and VLH=900 mV)
      1. Current on the un-selected rows-->Since the maximum voltage drop across the resistors on the un-selected rows is "VPGM−VLH=100 mV", the maximum current could be: 100 mV/RL (in this example, Imax=100 mV/10 kΩ=10 μA)
      2. Current on the selected row-->The maximum voltage drop is "VPGM=1V". Therefore maximum current is: 1V/RL=100 μA
      3. Current on the un-selected columns-->Voltage drop across all resistors except the one on the selected row is "0V" since both column and row of the un-selected cells are equal to "VLH". But the voltage drop of the resistor on the selected row is "VLH−0V". Thus, max current on the un-selected column=VLH/RL (900 mV/10 kΩ=90 μA)
      4. Current on the selected columns-->-->Voltage drop across all resistors except the one on the selected row is "VPGM−VLH=100 mV". But the voltage drop of the resistor on the selected row is "VPGM−0V". Thus, max current on the selected column=100 mV× (N−1)/RL+VPGM/RL (100 mV×127/10 kΩ+1V/10 kΩ=1270 μA+100 μA=1370 μA
6. After WRITE operation of hexFF, do READ from the selected row. Set the column and row voltages according to Step 2.i and Step 2.ii. And assign the output of this operation to REG2
7. COMPARE the data in REG2
   i. Check whether REG2 content is hexFF.
   ii. If not, then it means that VPGM level is not large enough to program the selected cell. So, increase VPGM and VLH by DV (e.g. 100 mV) and repeat the steps from "5" to "7"
   iii. If yes, then go to step "8", WRITE operation of "RLs".
8. WRITE operation of all "RL" s on the selected row
   i. Set the column index to "0" and select the column<0>.
   ii. Then set all rows and columns to "VLH" and set "VLH" as "100 mV"
   iii. If REG1<column index>="0" then perform RL write operation and go to step 8.iv. If it is not "0" then increase the column index and go to step 8.ii
   iv. Set selected row to "VPGM"
   v. Set the selected column to "VGND"
   vi. Worst case current calculation (assuming VPGM=1V and VLH=100 mV)
      1. Current on the un-selected rows-->Since the maximum voltage drop across the resistors on the un-selected rows is "VLH−VGND=100 mV", the maximum current could be: 100 mV/RL (in this example, Imax=100 mV/10 kΩ=10 μA)
      2. Current on the selected row-->the maximum voltage drop is "VPGM=1V". Therefore maximum current is: 1V/RL=100 μA
      3. Current on the un-selected columns-->Voltage drop across all resistors except the one on the selected row is "0V" since both column and row of the un-selected cells are equal to "VLH". But the voltage drop of the resistor on the selected row is "VPGM−VLH=900 mV". Therefore, max current on the un-selected row=VPGM/RL (900 mV/10 kΩ=90 μA)
      4. Current on the un-selected columns-->-->Voltage drop across all resistors except the one on the selected row is "VLH−VGND=100 mV". But the voltage drop of the resistor on the selected row is "VPGM−0V". Therefore, max current on the selected row=VLH× (N−1)/RL+VPGM/RL (VLH×127/10 kΩ+1V/10 kΩ=1270 μA+100 μA=1370 μA
9. After WRITE operation of RLs, do READ from the selected row. Set the column and row voltages according to Step 2.i and Step 2.ii. And assign the output of this operation to REG2
10. COMPARE the data in REG1 and REG2
    i. Find out whether all RLs of REG1 is programmed correctly.
    ii. If not, then it means that VPGM is not large enough to program the selected cell. So, increase VPGM by 100 mV and repeat the steps from "7" to "8"
    iii. Find out whether none of the RHs of REG1 is changed to RL in REG2.
    iv. If some or all of the RHs changed to "RL", it means the VLH need to be set higher than our expectation. So, increase VLH by 50 mV or 100 mV and repeat the steps from "8" to "10".

In other examples, writing RHs and RLs on the selected row could be done simultaneously for each column in step 5 and in step 8. If it is the case then, step 5 and step 8 could be:
5. WRITE Operation of hexFF on the selected row by selecting all columns
   i. Set VLH and VPGM voltage levels to their initial voltage levels (e.g. 0.9V and 1V)
   ii. Set all rows and columns to "VLH".
   iii. Set selected row to "VGND=0V"
   iv. Set all columns to "VPGM"
   v. Worst case peak current calculation (assuming VPGM=1V and VLH=900 mV)
      1. Current on the un-selected rows-->Since the maximum voltage drop across the resistors on the un-selected rows is "VPGM−VLH=100 mV", the maximum current could be: 100 mV×M/RL (in this example, Imax=100 mV×8/10 kΩ=80 μA)

Figure 35:
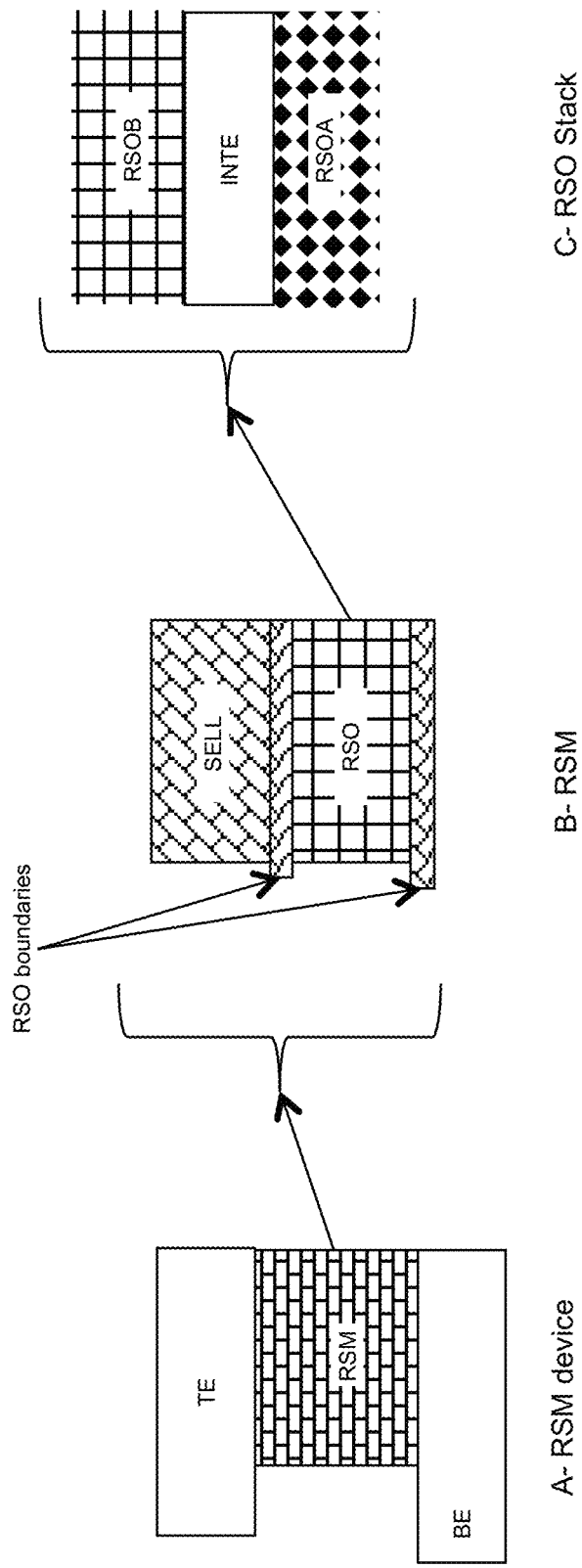
FIG. 35 shows the elements of an RSM stack, according to a preferred embodiment of the invention.

2. Current on the selected row-->The maximum voltage drop is "VPGM=1V". Therefore maximum current is: 1V×M/RL=800 µA
3. Current on the un-selected columns-->Voltage drop across all resistors except the one on the selected row is "0V" since both column and row of the un-selected cells are equal to "VLH". But the voltage drop of the resistor on the selected row is "VLH–0V". Thus, max current on the un-selected column=VLH/RL (900 mV/10 kΩ=90 µA)
4. Current on the selected columns-->-->Voltage drop across all resistors except the one on the selected row is "VPGM–VLH=100 mV". But the voltage drop of the resistor on the selected row is "VPGM–0V". Thus, max current on the selected column=100 mV× (N–1)/RL+VPGM/RL (100 mV×127/10 kΩ+1V/10 kΩ=1270 µA+100 µA=1370 µA 8. WRITE operation of all "RL"s on the selected row
   i. Set all rows and columns to "VLH" and set "VLH" as "100 mV"
   ii. Select all columns that needs to be written as "RL"
   iii. Set selected row to "VPGM"
   iv. Set all selected columns to "VGND"
   v. Worst case current calculation (assuming VPGM=1V and VLH=100 mV)
      1. Current on the un-selected rows-->Since the maximum voltage drop across the resistors on the un-selected rows is "VLH–VGND=100 mV", the maximum current could be: 100 mV×M/RL (in this example, Imax=100 mV×8/10 kΩ=80 µA)
      2. Current on the selected row-->the maximum voltage drop is "VPGM=1V". Therefore maximum current is: 1V×M/RL=800 µA (assuming only one cell on the selected row is going to be written)
      3. Current on the un-selected columns-->Voltage drop across all resistors except the one on the selected row is "0V" since both column and row of the un-selected cells are equal to "VLH". But the voltage drop of the resistor on the selected row is "VPGM–VLH=900 mV". Therefore, max current on the un-selected row=VPGM/RL (900 mV/10 kΩ=90 µA)
      4. Current on the selected columns-->-->Voltage drop across all resistors except the one on the selected row is "VLH–VGND=100 mV". But the voltage drop of the resistor on the selected row is "VPGM–0V". Therefore, max current on the selected row=VLH× (N–1)/RL+VPGM/RL (VLH×127/10 kΩ+1V/10 kΩ=1270 µA+100 µA=1370 µA Description of the RSM Device As shown in FIG. 35A an RSM is integrated between an electrically conductive TE and another electrically conductive BE, forming an RSM device. The RSM consists of a Resistive Switching Oxide (RSO), which is a transition metal oxide that has the property of modifying its resistivity upon application of either an electric field or a current flow at the RSO boundaries, and a Selector (SELL) element (see FIG. 35B). The SELL has the property of defining either voltage or current thresholds to ease the selections of a specific RSM device when integrated into arrays of RSM devices and can consist of unipolar diodes, bidirectional diodes, transistor or an additional RSO. The RSO element consists of a stack, the RSO stack, which is composed of two RSO elements (RSOA and RSOB) connected by an INTErmediate element (INTE). The INTE element can be a transition metal oxide or a mix of transition metal oxide layers and transition metal oxides, impacting the functionality of the RSM device.

FIFTH EXAMPLE

Figure 36:
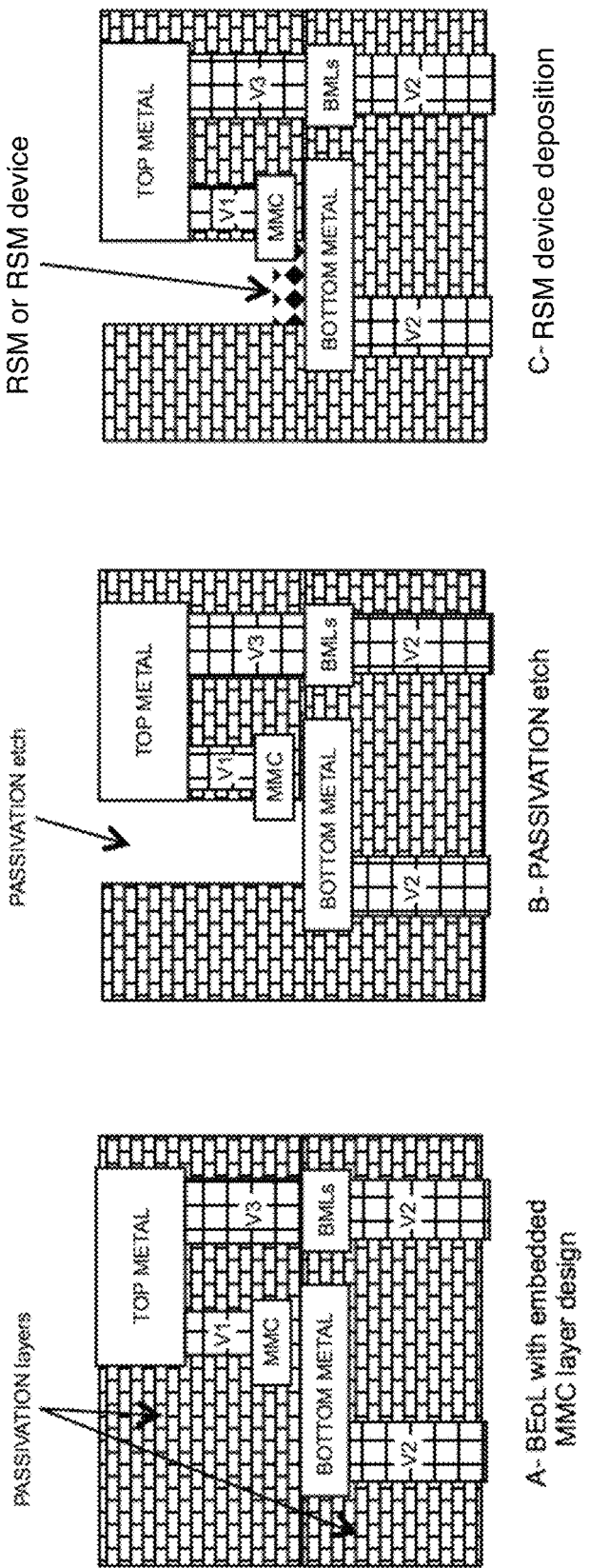
FIG. 36 shows a CMOS with an MMC layer that is connected through a VIA to the top metal electrode, according to a preferred embodiment of the invention.

The fifth example involves a process exploiting embedded features of the CMOS BEoL and as such, it does not require any lithographic steps. As shown in FIG. 36A, an MMC layer is connected through a VIA (V1) to the TOP METAL. The MMC layer is embedded in the BEoL by design facing a BOTTOM METAL. The TOP METAL is connected to the lower BOTTOM METAL layers (BMLs) through VIA (V3) and to the Front-End of the Line (FEoL) through VIA (V2). The BOTTOM METAL is connected to the FEoL through VIA (V2). The V2 elements consist of BMLs and other VIA according to the BEoL technology. In the example, the MMC has a certain overlap with an underneath BOTTOM METAL electrode, and by the rules of the BEoL technology, the MMC layer distance with the BOTTOM METAL is in the range of nanometers up to tens of nanometers. After a PASSIVATION opening step (FIG. 36B), the MMC layer and a section of the BOTTOM METAL is exposed. Then an RSM or an RSM device is deposited, covering the opening formed by the previous step (see FIG. 36C). In this way an RSM device is formed. The read/write circuit designed in the FEoL is thus connected to RSM elements through the MMC and the BOTTOM METAL, which are connected to other metal layers of the BEoL as part of the circuit design (done before post-processing).

SIXTH EXAMPLE

Figure 37:
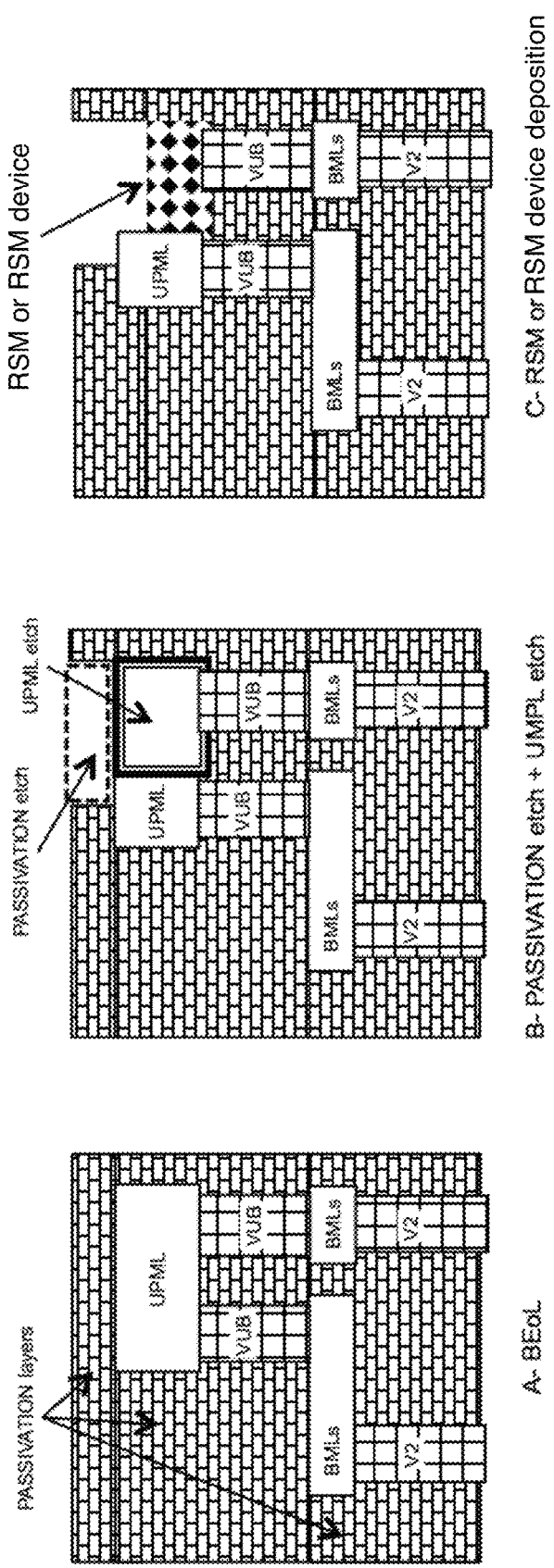
FIG. 37 shows a CMOS that involves additional one or two lithographic steps in order to obtain a RSM stack in between the last metal layer and the last via layer, according to a preferred embodiment of the invention.

In the sixth example, the RSM devices are deposited between the last metal layer of BEoL and the VIAs underneath. As an illustration, a schematic cross section and a tentative process flow of a co-integrated RSM devices into the CMOS BEoL are shown in FIG. 37. As shown if FIG. 37A the BEoL consists of metal lines and passivation layers. Then, in FIG. 37B a passivation via etch step is performed according to a predefined masking step to remove the passivation layer over a metal line. In addition, an UPper MetaL layer (UPML) is etched utilizing another mask, leaving a residual UPML and VIA (VUB) exposed. The UPML is connected to BMLs through VUBs. Then an RSM or an RSM device deposition sequence is performed, resulting in the structure shown in FIG. 37C, providing electrical contact between UPMLs and RSM (alternatively, an RSM device) or the UPML and the VUB through the RSM (alternatively, an RSM device), or the VUBs through the RSM (alternatively, an RSM device). The RSMs (alternatively, the RSM devices) are connected to the rest of the BEoL through VUBs and UPMLs.

SEVENTH EXAMPLE

Figure 38:
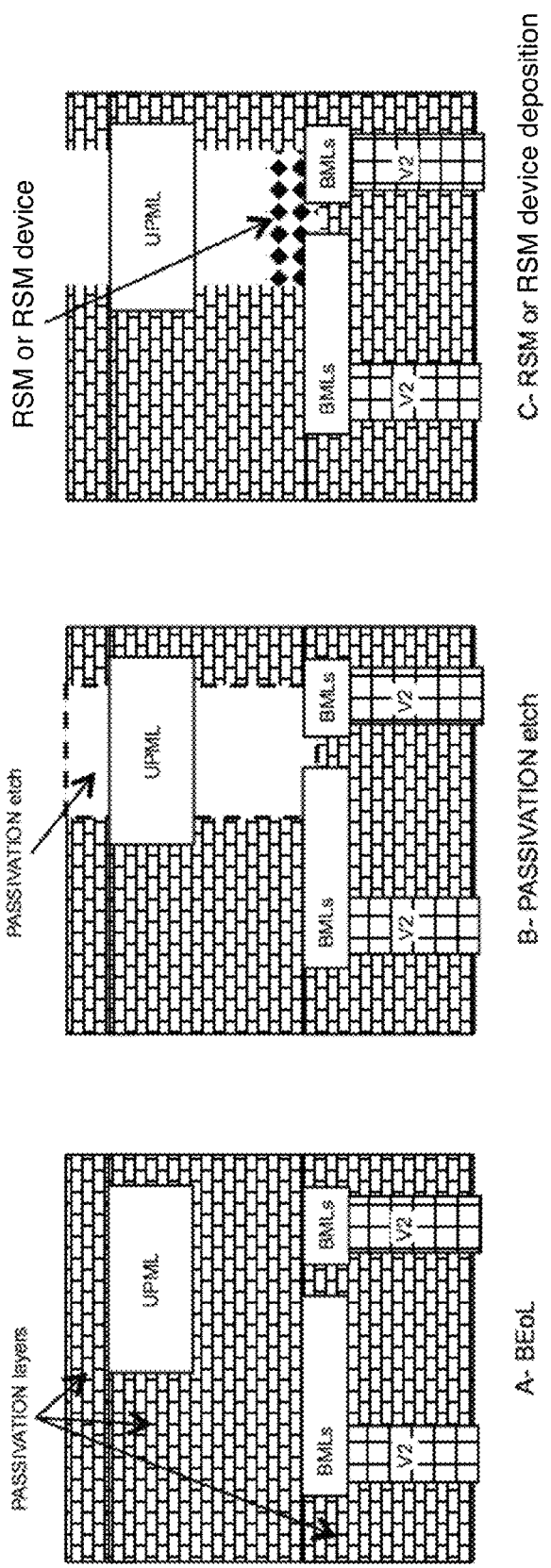
FIG. 38 shows a CMOS die fabricated such that the last CMOS BEoL includes patterns that can be used as a mask for the definition of top electrodes, according to a preferred embodiment of the invention.

To reduce the number of masking steps, the present seventh example, using only a unique step, is developed. As shown in FIG. 38A, the CMOS die is fabricated such that the CMOS BEoL includes patterns that can be used as a mask for the definition of the RSM devices. In this way the post-processing scheme is dramatically simplified, as it requires only one mask for the passivation etch, in case a selective passivation etching is required, or none, in the case where the passivation layers from the BMLs are not necessary.

The BEoL post-processing starts from the etching of the passivation layer FIG. 38B. This can require one masking step to define the passivation opening area. The passivation opening step is carried out to clear the passivation until at least two metal layers are exposed to the etching process FIG. 38B, for which the UPML is used as a pre-defined etching mask. Then an RSM or an RSM device is deposited on top of the BMLs (see FIG. 38C), to provide an electrically functional connection between different BMLs elements through the RSM elements (or the RSM device elements).

EIGHTH EXAMPLE

Figure 39:
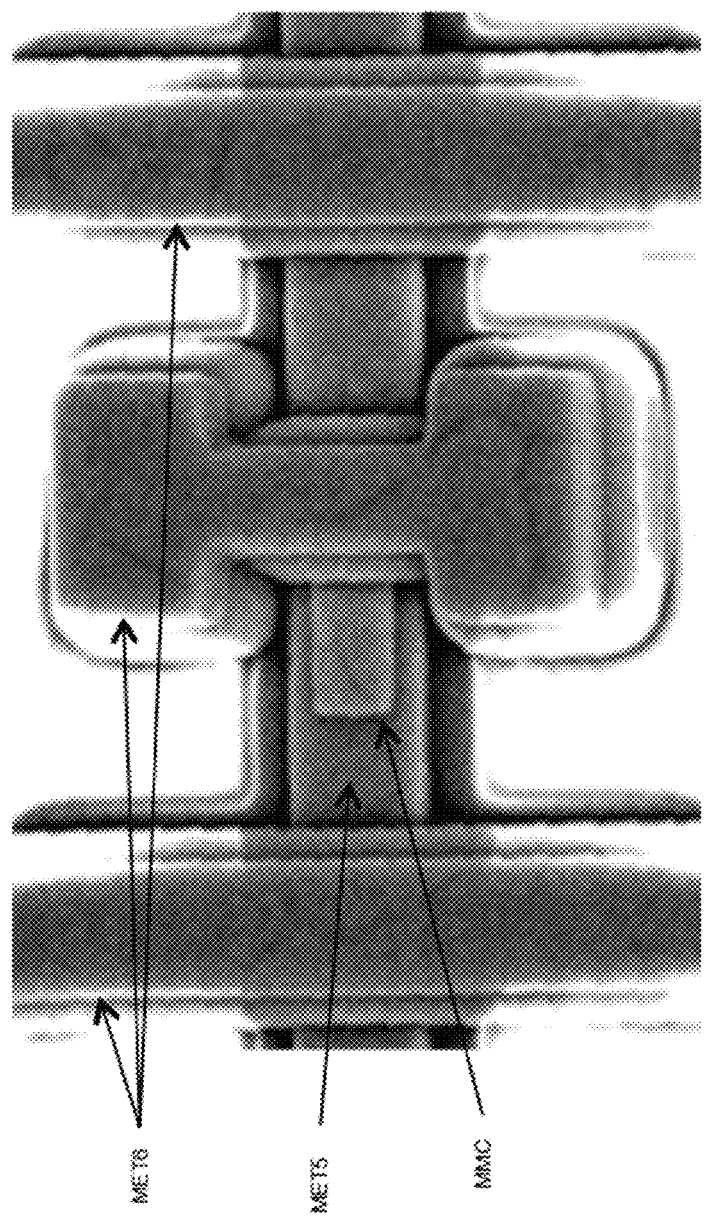
FIG. 39 shows a detail of a post-processed CMOS die, for which the passivation of the top two metal layers has been etched, according to a preferred embodiment of the invention.

An example of post-processed CMOS chip is shown in the SEM image of FIG. 39. The chip BEoL has 6 metal layers and an MMC layer. The MMC layer is connected with the rest of the BEoL through a VIA and MET6. The MMC layer was designed to overlap with MET5 lines, so to provide an overlapping region for an RSM or an RSM device to be deposited. In FIG. 39, the MET5, MMC and MET6 layers are exposed as a consequence of a passivation etch step.

Perspective Performance
  The read/write operation of resistive memory arrays. In particular, the invention enables the read/write operation of large arrays of RSM devices.
  The post-processing enables heterogeneous integration of large arrays of RSM devices with CMOS, beneficial for several applications.

Prospective Applications
FPGAs.
  In FPGAs, RSM devices can be used as routing resource by employing the resistance of the RSM as a switch. Moreover, two or more RSM devices can be connected in such a way that a complementary resistive switching cell is formed. This is beneficial for efficient programming of the RSM-based routing resources. Similarly, RSM can also be used as standalone memories in FPGAs. The low voltage operation and the high Resistance Ratio enable to scale the technology and to improve noise margins, respectively.

Standalone Memories
  A large resistive ratio of the RSM enables to improve noise margin, thus relaxing the requirements for the peripheral circuitry needed for the read/write operations in standalone memories. It is important to notice that the scalability and the multi-valued features are extremely important for standalone memories to be competitive.

Dense Cross-Bars
  As per the previous application, the scalability and the multi-value features are keys for dense cross-bar applications.

Neural Networks
  Arrays of RSM devices might be implemented in neuromorphic circuits in specific blocks. For instance, the RSM device can be utilized to emulate the artificial synapse behavior. Due to the requirements of a large number of synaptic interconnections and the capability to store a range of resistance states to express potentiation and/or depression of a synaptic interconnect, multi-value and scalability features are also very important.

REFERENCES

[1] Y. Kim, and J. Lee, "Reproducible resistance switching characteristics of hafnium oxide-based nonvolatile memory devices," J. of App. Phys., 104(11):114-115, December 2008.
[2] W. Zhu et al., "Charging-induced changes in reverse current-voltage characteristics of Al/Al-Rich $Al_2O_3$ p-Si Diodes," IEEE Trans. on Electron Devices, 56(9):2060-2064, September 2009.
[3] R. Waser, and M. Aono, "Nanoionics-based resistive switching memories," Nature Materials, 6:833-840, November 2007.
[4] C. Cagli et al., "Experimental and Theoretical Study of Electrode Effects in HfO2 based RRAM," IEDM Tech. Dig., pp. 28.7.1, 2011.
[5] Wei et al., "Highly reliable TaOx ReRAM and direct evidence of redox reaction mechanism," IEDM 2008
[6] F. Miao et al., "Continuous Electrical Tuning of the Chemical Composition of TaOx-based Memristors", ACS Nano, 6(3), pp. 2312-2318, 2012.
[1A] G. W. Burr et al., "Overview of candidate device technologies for storage-class-memory," IBM J. R&D, 52(4/5), 2008.
[2A] Y. S. Chen et al., "Challenges and Opportunities for $HfO_x$ Based Resistive Random Access Memory," IEDM Tech. Dig., 2011.
[3A] S.-S. Sheu et al., "A 4 Mb Embedded SLC Resistive-RAM Macro with 7.2 ns Read-Write Random-Access Time and 160 ns MLC-Access Capability," ISSCC Tech. Dig., 2011.
[4A] M. Lin et al., "Performance Benefits of Monolithically Stacked 3-D FPGA," IEEE TCAD, 26(2), 2007.
[5A] V. Betz et al., "Architecture and CAD for Deep-Submicron FPGAs", Kluwer Academic Publishers, 1999.
[6A] K. J. Han et al., "Flash-based Field Programmable Gate Array Technology with Deep Trench Isolation," IEEE CICC, 2007.
[7A] Y. Y. Liauw et al., "Nonvolatile 3D-FPGA With Monolithically Stacked RRAM-Based Configuration Memory," ISSCC Tech. Dig., 2012.
[8A] D. Sacchetto et al., "Resistive Programmable Through Silicon Vias for Reconfigurable 3D Fabrics, IEEE TNANO, 11(1):8-11, 2012.
[9A] P.-E. Gaillardon et al., "Emerging memory technologies for reconfigurable routing in FPGA architecture," ICECS Tech. Dig., 2010.
[10A] S. Tanachutiwat, M. Liu, and W. Wang, "FPGA Based on Integration of CMOS and RRAM," IEEE TVLSI, 19(11):2023-2032, November 2011.
[11A] J. Cong and B. Xiao, "mrFPGA: A novel FPGA architecture with memristor-based reconfiguration," NANOARCH Tech. Dig., 2011.
[12A] E. Linn, R. Rosezin, C. Kügeler and R. Waser, "Complementary resistive switches for passive nanocrossbar memories," Nature materials, 2010.
[13A] http://www.eda.ncsu.edu/wiki/FreePDK/
[14A] Emerging Research Devices, 2011 Edition, ITRS
[15A] Berkeley Logic Synthesis and Verification Group, ABC, Release 70930. http://www.eecs.berkeley.edu/~alanmi/abc/
[16A] J. Luu et al., "Architecture description and packing for logic blocks with hierarchy, modes and complex interconnect," ACM FPGA Symp., 2011.

The invention claimed is:
1. A bipolar resistive switching device comprising:
  an electrically conductive bottom electrode;
  a stack of transition metal oxides layers, a number of transition metal oxide layers being equal or greater than 2, the stack comprising:
    at least one MOx layer,
    at least one oxygen gettering layer $NO_y$; and
  the resistive switching device further comprises
  an electrically conductive top electrode.
2. The switching device of claim 1, wherein the oxygen gettering layer comprises a transition metal oxide taken from the list comprising: $CrO_y$, $TiO_y$, $HfO_y$, $NbO_y$.
3. The switching device of claim 2, wherein a value of the stochiometric number y is in the range $0<y \leq 2$.

4. The switching device of claim 1, wherein values of the stochiometric number x is in the range $0<x\leq2.5$.

5. The switching device of claim 1, wherein the metal M is taken from the list comprising: Cr, Ti, Hf, Ta, Nb.

6. The switching device of claim 1 wherein the stack of transition metal oxide layer further includes at least one layer of metal (INTE).

7. A circuit comprising 2 bipolar resistive switching devices as described in claim 1, the 2 bipolar resistive switching devices being serially connected in such a way that their polarities are opposed.

8. A programming operation of the circuit of claim 7, wherein each one of the voltage signals $-5V\leq V_{p1}\leq+5V$, $-5V\leq V_{p2}\leq+5V$, $-5V\leq V_{p3}\leq+5V$ are simultaneously applied to each one of the electrodes forming the circuit, causing the two bipolar resistive switching devices to simultaneously change resistive state.

* * * * *